(12) United States Patent
Vidarsson

(10) Patent No.: US 10,018,694 B2
(45) Date of Patent: Jul. 10, 2018

(54) MAGNETIC RESONANCE IMAGING (MRI) SYSTEM AND METHOD

(71) Applicant: LT Imaging Inc., Toronto (CA)

(72) Inventor: Logi Vidarsson, Toronto (CA)

(73) Assignee: LT Imaging Inc., Toronto (CA)

( * ) Notice: Subject to any disclaimer, the term of this patent is extended or adjusted under 35 U.S.C. 154(b) by 531 days.

(21) Appl. No.: 14/644,725

(22) Filed: Mar. 11, 2015

(65) Prior Publication Data

US 2015/0260809 A1    Sep. 17, 2015

(30) Foreign Application Priority Data

Mar. 13, 2014 (CA) ...................................... 2845965
Mar. 6, 2015 (CA) ...................................... 2884097

(51) Int. Cl.
*G01R 33/38* (2006.01)
*G01R 33/383* (2006.01)

(52) U.S. Cl.
CPC ........ *G01R 33/383* (2013.01); *G01R 33/3802* (2013.01); *Y10T 29/49075* (2015.01)

(58) Field of Classification Search
USPC .......................... 324/262, 209, 316, 318, 320
See application file for complete search history.

(56) References Cited

U.S. PATENT DOCUMENTS

| | | |
|---|---|---|
| 4,538,130 A | 8/1985 | Gluckstern et al. |
| 5,025,216 A | 6/1991 | Pauly et al. |
| 5,148,138 A | 9/1992 | Miyata |
| 5,319,339 A | 6/1994 | Leupold |
| 5,320,103 A | 6/1994 | Rapoport et al. |
| 5,550,472 A | 8/1996 | Richard et al. |
| 5,621,324 A | 4/1997 | Ota et al. |
| 5,631,616 A | 5/1997 | Ohta et al. |
| 5,659,250 A | 8/1997 | Domigan et al. |
| 5,717,333 A | 2/1998 | Frese et al. |
| 5,825,187 A | 10/1998 | Ohashi et al. |
| 5,900,793 A | 5/1999 | Katznelson et al. |
| 6,163,154 A | 12/2000 | Anderson et al. |
| 6,191,584 B1 | 2/2001 | Trequattrini et al. |
| 6,275,128 B1 | 8/2001 | Aoki et al. |
| 6,351,125 B1 | 2/2002 | Westphal |
| 7,023,309 B2 | 4/2006 | Laskaris et al. |
| 7,245,128 B2 | 7/2007 | Ando et al. |
| 7,345,479 B2 | 3/2008 | Park et al. |

(Continued)

FOREIGN PATENT DOCUMENTS

WO    WO 2013135257 A2 *  9/2013  ............. H02K 21/16

OTHER PUBLICATIONS

Cooley et al., "Two-Dimensional Imaging in a Lighweight Portable MRI Scanner without Gradient Coils", Magnetic Resonance in Medicine 00:1-12 (2014).

(Continued)

*Primary Examiner* — Vincent Q Nguyen
(74) *Attorney, Agent, or Firm* — Vidas Arrett & Steinkraus

(57) ABSTRACT

A magnetic resonance imaging (MRI) system and method of magnetic resonance imaging. The preferred MRI system is of lower weight and/or uses less power than conventional MRI systems, due to one or more of magnet design, transmit and receive coil design, selection of RF pulse sequence, synchronization methods, and image reconstruction methods. Preferably, the MRI system is portable.

17 Claims, 26 Drawing Sheets

(56) References Cited

U.S. PATENT DOCUMENTS

| | | |
|---|---|---|
| 7,403,006 B2 | 7/2008 | Garwood et al. |
| 7,760,059 B2 | 7/2010 | Higuchi |
| 8,148,988 B2 | 4/2012 | Blumich et al. |
| 8,860,539 B2 | 10/2014 | Sakellariou et al. |
| 2013/0088225 A1 | 4/2013 | Weller et al. |
| 2014/0111202 A1 | 4/2014 | Wald et al. |
| 2014/0375160 A1* | 12/2014 | Zhang .................. H02K 21/16 310/154.26 |

OTHER PUBLICATIONS

Lustig et al., "Sparse MRI: The Application of Compressed Sensing for Rapid MRI Imaging", Magnetic Resonance in Medicine 58-1182-1195 (2007).

Tadic et al., "Design and Optimization of Superconducting MRI Magnet Systems With Magnetic Materials", IEEE Transactions on Applied Superconductivity, vol. 22, No. 2, Apr. 2012, 7 pages.

Fletcher et al., "Function minimization by conjugate gradients", The Computer Journal, 1964, 149-154.

\* cited by examiner

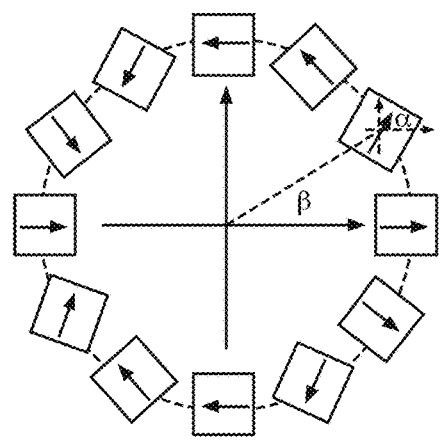
Fig. 1
Prior Art
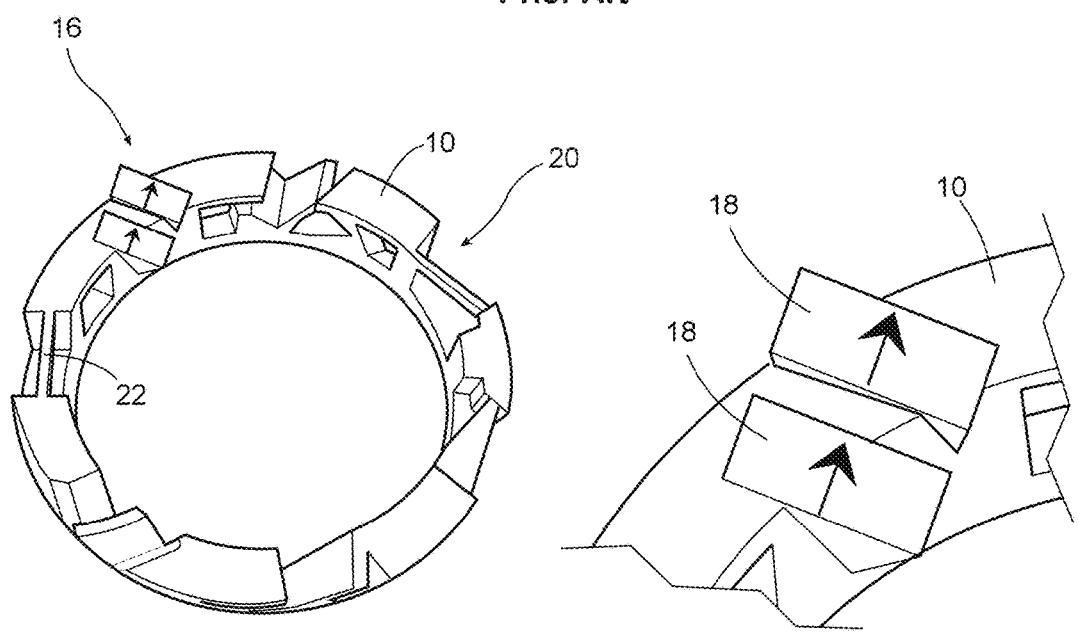
Fig. 2
Fig. 3

32

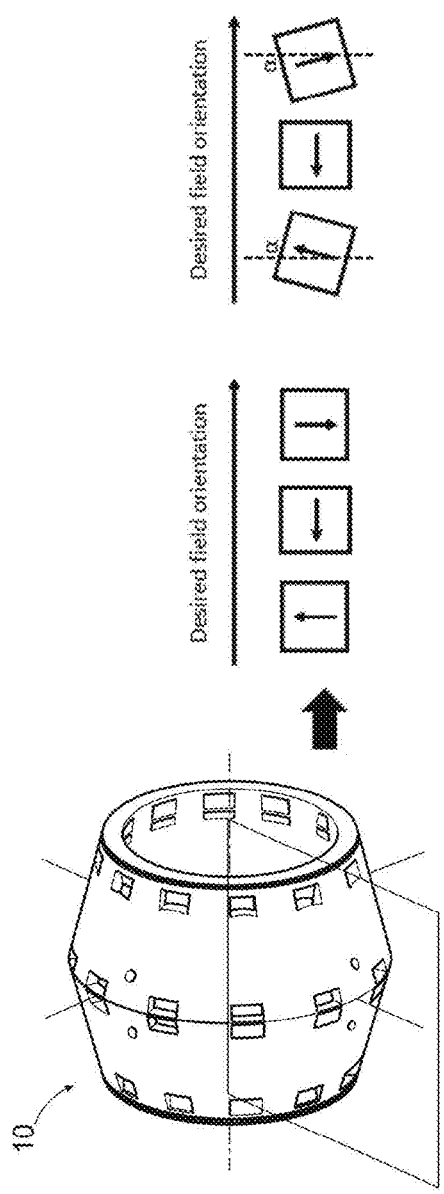
Fig. 33
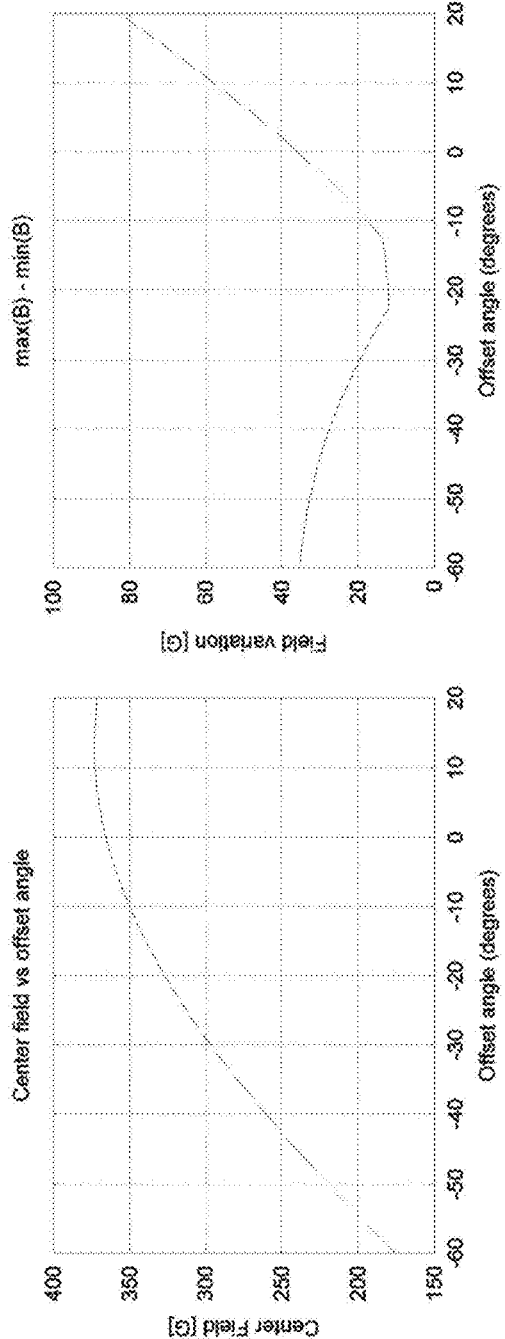
Fig. 34
Fig. 35

MAGNETIC RESONANCE IMAGING (MRI) SYSTEM AND METHOD

FIELD OF THE INVENTION

The present invention relates to magnetic resonance imaging (MRI) systems and methods of magnetic resonance imaging. More particularly, the present invention relates to a magnetic field generator for an MRI device and methods for making same.

BACKGROUND OF THE INVENTION

Conventional magnetic resonance imaging (MRI) systems while producing excellent image quality, are heavy and immobile.

For example, conventional MRI systems utilizing superconducting magnet systems which are now common-place, require a significant amount of helium gas to be vented to the outside during emergencies. The reliance on a superconducting magnet system, and the requirement that the helium gas be vented to the outside are some of the main reasons why traditional MRI systems are non-portable. In essence, such MRI systems need to be permanently installed in dedicated room equipped with a suitable helium vent.

More recently, magnet designers have been focussing on creating ever stronger and more homogenous magnets. By way of example, magnetic field strengths of 7 T are now commercially available. Surprisingly, the field uniformity is only several parts per million. This is prompted by the desire to obtain evermore signal that can then be traded for desirable imaging attributes, such as increased spatial resolution or decreased scan time.

While stronger magnetic fields do improve signal, the latter condition, high magnetic-field uniformity, has come under some strain. Sequence innovations like short T2 imaging techniques disclosed in U.S. Pat. No. 5,025,216, for example, allow an MRI system to live with greater field inhomogeneities than ever before. However, one consequence of increasing field inhomogeneities is increased demands for radio-frequency (RF) transmit power, as the bandwidth one asks of the transmit system is increased. One attempt to work around this issue is disclosed in U.S. Pat. No. 7,403,006, which teaches a carefully designed frequency sweep.

A further problem that has received some attention over the years is of how to arrange magnet segments to achieve a desired magnetic field profile. For example, the circular Halbach array discovered by Klaus Halbach and described for example in U.S. Pat. Nos. 4,538,130 and 5,148,138, consists of a series of magnet segments arranged in a ring around the desired volume as is shown in FIG. 1. As can be seen, each magnet segment has a magnetization direction, and the magnet segments are arranged in a ring so that their magnetization directions are all aligned with a plane defined by the ring. Furthermore, the magnet segments are arranged to orient their magnetization directions to progressively make two rotations through adjacent magnet segments in one direction of the ring. As shown in FIG. 1, angle $\alpha$ is chosen to maximize its contribution to the magnetic field in the center of the ring, which turns out to be $\alpha=2\beta$, where $\alpha$ is the angle the magnet segment's center location makes to the magnetic field axis oriented at the center of the ring.

Multiple Halbach rings may be used as taught in for example U.S. Pat. No. 5,148,138 to extend the magnetic field profile.

Magnet assemblies using these principles have been built for the purposes of MRI as taught in, for example Clarissa Zimmerman Cooley, Jason P. Stockmann, Brandon D. Armstrong, Mathieu Sarracanie, Michael H. Lev, Matthew S. Rosen, and Lawrence L. Wald, "Two-Dimensional Imaging in a Lightweight Portable MRI Scanner without Gradient Coils", (2014) Magnetic Resonance in Medicine 00:1-12, and U.S. Pat. App. Pub. No. 2014/0111202. However, at 45 kg, the magnet assembly is fairly heavy for portable applications.

Other prior art documents of general interest include:
Lustig et al., "Sparse MRI: The Application of Compressed Sensing for Rapid MR Imaging", (2007) *Magnetic Resonance in Medicine,* 58:1182-1195 (Lustig);
Tony Tadic and B. Gino Fallone, "Design and Optimization of Superconducting MRI Magnet Systems With Magnetic Materials", (2012) IEEE Transactions on Applied Superconductivity, 22(2):4400107-4400107 (Tardic);
Fletcher, R., and Reeves, C. M., "Function minimization by conjugate gradients", (1964) The Computer Journal, 149-154 (Fletcher);
U.S. Pat. No. 5,319,339 (Leupold);
U.S. Pat. No. 5,320,103 (Rapoport);
U.S. Pat. No. 5,550,472 (Richard);
U.S. Pat. No. 5,621,324 (Ota);
U.S. Pat. No. 5,631,616 (Ohta);
U.S. Pat. No. 5,659,250 (Domigan);
U.S. Pat. No. 5,717,333 (Frese);
U.S. Pat. No. 5,825,187 (Ohashi);
U.S. Pat. No. 5,900,793 (Katznelson);
U.S. Pat. No. 6,163,154 (Anderson);
U.S. Pat. No. 6,191,584 (Trequaffrini);
U.S. Pat. No. 6,275,128 (Aoki);
U.S. Pat. No. 6,351,125 (Westphal);
U.S. Pat. No. 7,023,309 (Laskaris);
U.S. Pat. No. 7,245,128 (Ando);
U.S. Pat. No. 7,345,479 (Park);
U.S. Pat. No. 7,403,006 (Garwood);
U.S. Pat. No. 7,760,059 (Higuchi);
U.S. Pat. No. 8,148,988 (Blumich);
U.S. Pat. No. 8,860,539 (Sakellariou); and
U.S. Pat. App. Pub. No. 2013/0088225 (Weller).

Accordingly, there is continued need for improvements in MRI systems and MRI methods.

SUMMARY OF THE INVENTION

What is desired is a lighter MRI system, which is preferably mobile, while preserving image quality comparable to that obtainable with heavier conventional MRI systems. Preferably, the magnetic field generator of the MRI system is sufficiently lightweight to permit it to be carried by a person.

A magnetic resonance imaging (MRI) system according to the present invention is preferably of lower weight and/or uses less power than conventional MRI systems. Most preferably, the MRI system may also be portable. As described in more detail below the features of reduced weight and power consumption of embodiments of the MRI system according to the present invention, are a function of one or more of magnetic field generator design, transmit and receive coil design, selection of RF pulse sequence, synchronization methods, and image reconstruction methods, which features are discussed in more detail below.

According to an embodiment of the present invention, a plurality of magnet segments are arranged in two or more rings such that the magnet segments are evenly spaced apart from adjacent magnet segments in the same ring, and spaced apart from magnet segments in adjacent rings.

According to yet another embodiment of the present invention, a plurality of magnet segments are arranged in two or more rings with the magnetization directions of at least some of the magnet segments being unaligned with a plane defined by their respective ring, to provide greater control over the resulting magnetic field profile.

According to yet another embodiment of the present invention, the magnetic field generator may be made with a 3D printer, allowing the magnetic field profile to be controlled to a greater degree, than is possible with rigid frames made using conventional manufacturing processes.

According to another embodiment of the present invention, a fast pulse sequence may be used to expand the MRI system's tolerance to reduced T2 and T2* parameters (and hence, tolerance to increased magnetic field inhomogeneity), thereby allowing the magnetic field generator to trade system weight for field inhomogeneity.

According to yet another embodiment of the present invention, a unique coil design may be used to allow for a fairly selective slice profile without the need for slice selective RF pulses. Additionally, the coil system may be mechanically tuned to minimize coupling between transmit and receive.

According to yet another embodiment of the present invention, the RF system may be monitored by inserting sporadic low-power monitoring pulses into the pulse sequence.

According to yet another embodiment of the present invention, a pseudo-random synchronization scheme (akin to what is used in the global positioning system (GPS)) may be used to synchronize transmit and receive chains.

According to yet another embodiment of the present invention, an image reconstruction technique may be developed to reconstruct images.

Therefore, according to one aspect of the present invention, there is provided a magnet assembly for a magnetic resonance imaging (MRI) instrument, said magnet assembly comprising:
  a body having an opening through said body sized and shaped to receive an object, said opening defining a longitudinal axis through a centre of said opening; and
  a plurality of permanent magnet segments, each having a magnetization direction, attached to said body to generate a magnetic field profile within said opening, said plurality of permanent magnets being arranged in each of a first ring and a second ring, said plurality of permanent magnet segments being evenly spaced from adjacent permanent magnet segments in each of said respective first and second rings;
  wherein said permanent magnet segments define two rotations of said magnetization directions in each of said respective first and second rings;
  wherein at least some of said magnetization directions of said permanent magnet segments in said first and second rings are oriented out of alignment with a plane perpendicular to said longitudinal axis.

According to another aspect of the present invention there is provided an MRI instrument comprising:
  the above magnet assembly; and
  a radio frequency coil for generating RF energy and receiving magnetic resonance signals from an object positioned in said magnet assembly.

According to another aspect of the present invention there is provided a method for making a magnet assembly for a magnetic resonance imaging (MRI) instrument, said method comprising the steps of:
  a) determining a desired magnetic field profile;
  b) determining center locations for each of a plurality of permanent magnet segments evenly spaced apart from one another in each of at least two spaced apart rings centred on a longitudinal axis and sized to accommodate a desired imaging volume;
  c) determining an initial magnetization direction for each of said permanent magnet segments based on a Halbach array arrangement;
  d) estimating a magnetic field profile based on said initial magnetization directions of said permanent magnet segments; and
  e) applying a conjugate gradient algorithm using said estimated magnetic field profile and said desired magnetic field profile to obtain updated magnetization directions for each of said plurality of permanent magnet segments to generate a magnetic field profile having an acceptable error to said desired magnetic field profile.

BRIEF DESCRIPTION OF THE DRAWINGS

Reference will now be made to the preferred embodiments of the present invention with reference, by way of example only, to the following drawings in which:

FIG. 1 shows a prior art circular Halbach array, in which the desired magnetic field direction is directed along the x-axis, and each permanent magnet is oriented at an angle $\alpha$ to the center of the array and $\beta$ is the angle the permanent magnet's center location makes to the desired magnetic field direction, where $\alpha=2\beta$;

FIG. 2 shows one part of a two part body of a magnet assembly with one permanent magnet segment comprising a pair of permanent magnets attached to one of seven magnet holders;

FIG. 3 shows a close-up of the permanent magnet segment attached to the body of FIG. 2;

FIG. 33 shows at the left a magnet assembly comprising 36 magnet holders for attaching a plurality of permanent magnet segments arranged in 3 rings according to another embodiment of the present invention, at middle the initial magnetization directions for 3 of the plurality of permanent magnet segments held in a row of magnet holders, and at right, the updated magnetization directions for the 3 permanent magnet segments with an offset angle $\alpha$;

FIG. 34 shows a graph of the magnetic field strength at the center of the imaging volume as a function of the offset angle $\alpha$ of FIG. 33;

FIG. 35 shows a graph of the field variation (inhomogeneity) of the estimated magnetic field profile generated by the magnetization directions updated with the offset angle $\alpha$ as a function of the offset angle $\alpha$ of FIG. 33;

DETAILED DESCRIPTION OF THE PREFERRED EMBODIMENTS

Figure 4:
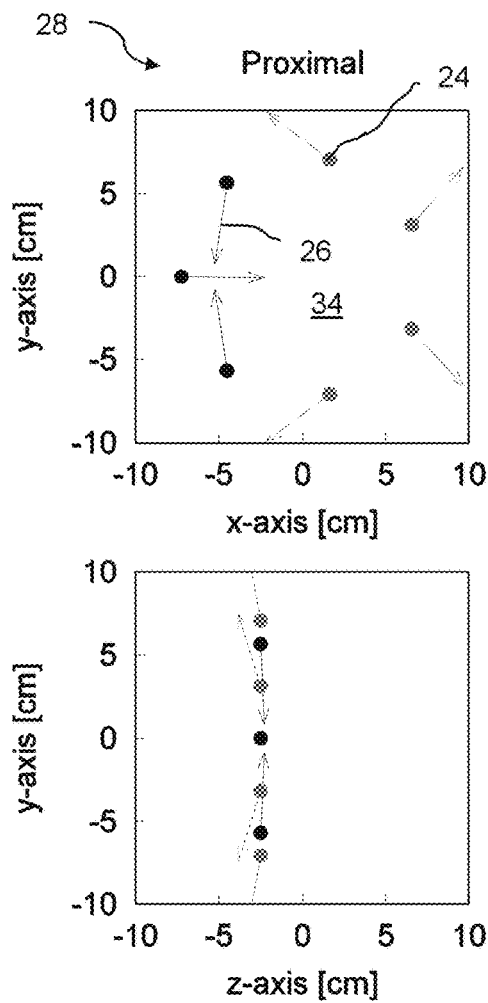
FIG. 4 shows magnetic field directions for a plurality of permanent magnet segments attached to a magnet assembly according to an embodiment of the present invention in an x/y plane.

The present invention is described in more detail with reference to exemplary embodiments thereof as shown in the appended drawing. While the present invention is described below including preferred embodiments, it should be understood that the present invention is not limited thereto. Those of ordinary skill in the art having access to the teachings herein will recognize additional implementations, modifications, and embodiments which are within the scope of the present invention as disclosed and claimed herein.

Magnetic Field Generator

An MRI system according to an embodiment of the present invention preferably uses a magnetic field generator made with permanent magnets. Using permanent magnets obviates the need for helium gas which is used as a coolant in the superconducting magnet systems in conventional MRI systems, and so overcomes the requirement for a helium vent.

Preferably, the permanent magnet system has a desired magnetic field profile throughout the volume to be imaged. Traditionally, the desired magnetic profile has been a homogeneous, high field (1.5 Tesla/3 Tesla with homogeneity better than 10 parts per million (ppm)). Since the magnetic field profile is very inhomogeneous close to the magnets, in order to achieve the desired magnetic field profile, the permanent magnets are often spaced far away from the imaging volume. However, positioning the magnets further away from the imaging volume requires using more magnets to compensate for the decrease in the magnetic field strength that results from moving the permanent magnets further away from the imaging volume. The disadvantage of using more magnets is that it results in a heavier magnetic field generator.

A 10 ppm uniformity requirement is difficult to achieve. Surprisingly, however, as long as the magnetic field profile is known, a reliable magnetic resonance (MR) image can be obtained. In fact, during a routine clinical MRI, a gradient system is often used to purposely induce controlled field inhomogeneities for the purposes of generating an image. These inhomogeneities can be on the order of 1000 ppm.

Embodiments of the present invention will now be described with reference to the following examples.

Example 1

Referring now to FIG. 2, there is shown one part 10 of a two part body of a magnet assembly 12 for a magnetic resonance imaging (MRI) instrument 14 according to an embodiment of the present invention. A permanent magnet segment 16, comprising a pair of cuboid shaped permanent magnets 18, is shown to be held in one of seven magnet holders 20 evenly spaced on the one part of the body 10. Preferably, the two parts of the body 10 of the magnet assembly 12 are made by 3D printing. However, it will be appreciated that the magnet holder may be made by other methods available to the person skilled in the art.

FIG. 3 shows a close-up of a pair of cuboid shaped permanent magnets 18 attached to the magnet holder 20 of FIG. 2. Preferably, the cuboid shaped permanent magnets 18 may be 1×1×1/2 inch NbFe magnets, which clamp to an attachment member 22 of the magnet holder 20 by the force of their magnetic attraction to one another. However, other shapes, sizes and compositions of permanent magnets 18 may be used as will be appreciated by persons skilled in the art. For example, cylinder-shaped, arc-shaped, and ring-shaped permanent magnets are commercially available. Good results have been obtained with an attachment member 22 in the form of a 3 mm thick wall. Preferably, the two parts of the body 10 are secured together with non-magnetic screws (not shown) to form the magnet assembly 12 having two symmetric rings containing seven permanent magnet segments 16 each, for a total of 28 1×1×1/2 cuboid shaped permanent magnets. The resulting body 10 is a cylinder with the opening from a proximal end of the cylinder to the distal end of the cylinder defining the imaging volume. The opening defines a longitudinal z-axis LZ through the centre of the opening, from the proximal end of the cylinder to the distal end of the cylinder.

Figure 5:
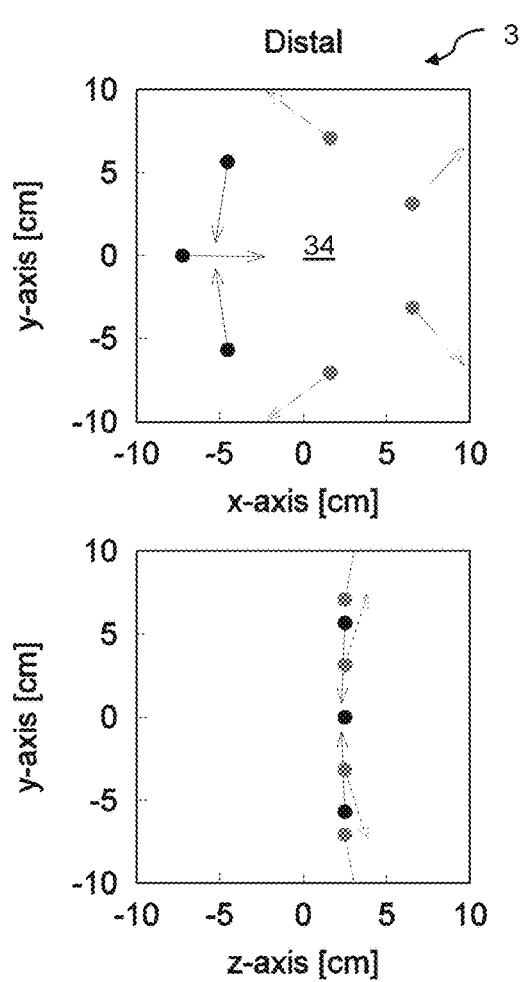
FIG. 5 shows magnetic field directions for the plurality of permanent magnet segments of FIG. 4 in a y/z plane.

A representation of the arrangement of the 14 permanent magnet segments 16 on the body 10 of the magnet assembly 12 is shown in FIGS. 4 and 5. The top graphs of each figure represent views of the center positions and magnetization directions of the permanent magnet segments 16 in the x/y plane, as they appear facing the proximal end of the cylindrical body 10, wherein left/right is represented by the x-axis, up/down is represented by the y-axis, and the 0,0 point is the centre of the imaging volume. The bottom graphs of each figure represent views of the center positions and magnetization directions of the permanent magnet segments in the y/z plane, as they appear facing the right side of the cylindrical body 10, such that the proximal end is oriented on the left, and the distal end is oriented on the right. Taken together, these figures show the arrangement of the permanent magnet segments in the two rings, namely a proximal ring and a distal ring, in terms of the positions of their center locations 24 and magnetization directions 26. As can be seen in the x/y graphs, the permanent magnet segments 16 define two rotations of the magnetization directions in each of the two rings (proximal ring and distal ring), which is consistent with the circular Halbach array, for example as shown in FIG. 1. However, the y/z graphs for the rings shows that the magnetization directions 26 of the permanent magnet segments 16 are oriented out of alignment with their respective rings. In other words, the magnetization directions 26 are out of alignment with a plane perpendicular to the longitudinal z-axis LZ, which is a surprising departure from the circular Halbach array.

As can be seen in FIGS. 4 and 5, the permanent magnet segments 16 are arranged in two spaced apart rings on the body 10 of the magnet assembly 12, namely a proximal ring 28, and a distal ring 30, and within each ring the permanent magnet segments 16 are evenly spaced from adjacent permanent magnet segments 16. The permanent magnet segments 16 define two rotations of the magnetization directions 26 in each of the respective rings, and six of the seven permanent magnet segments 16 are arranged so that their magnetization directions 26 are oriented out of alignment with a plane perpendicular to the longitudinal z-axis LZ. In other words, the magnetization directions 26 of some of the permanent magnet segments 16 are oriented out of alignment with a plane defined by the respective ring in which the permanent magnet segments 16 are positioned. The permanent magnet segments 16 are arranged in this way to generate a desired magnetic field profile 32 within the opening 34 extending through the magnet assembly 12. Although, this example is directed to an arrangement of permanent magnet segments 16 arranged in two rings on the body 10 of the magnet assembly 12, as discussed in more detail below, the present invention comprehends more than two rings of permanent magnet segments 16.

Figure 6:
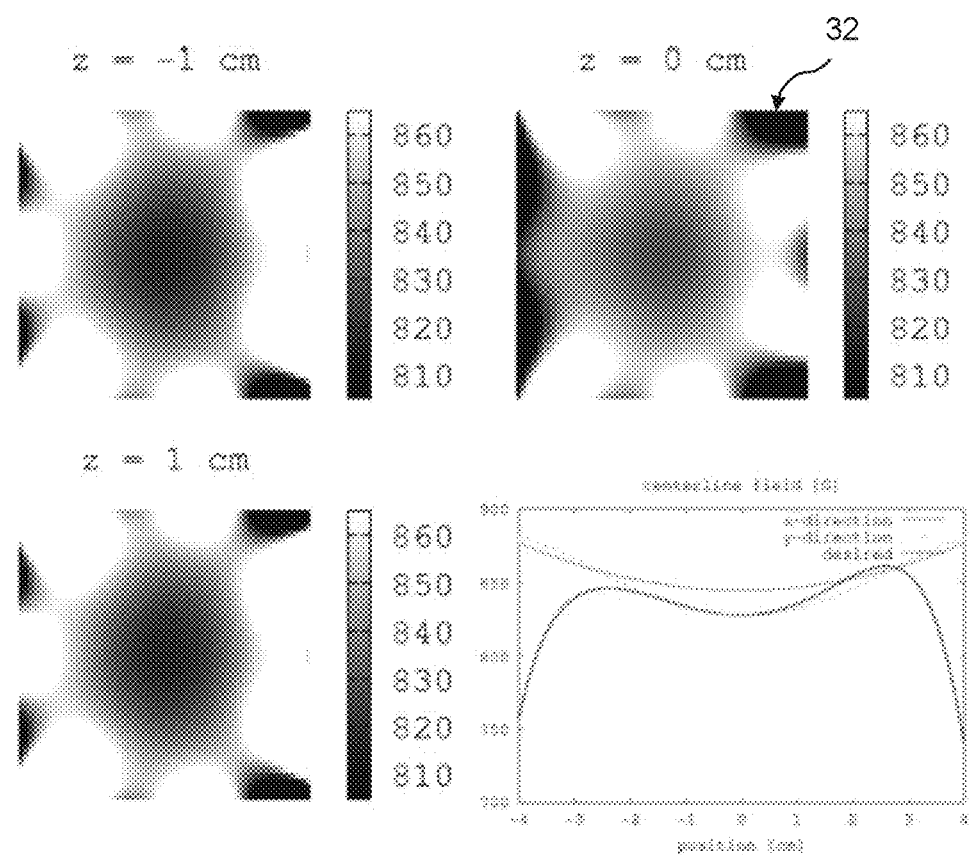
FIG. 6 shows estimated magnetic field profiles generated by the plurality of permanent magnet segments of FIG. 4 at z=−1 cm, z=0 cm and z=1 cm, and a graph of the estimated magnetic field profile generated by the permanent magnet segments of FIG. 4 at z=0 and the desired magnetic field profile.

FIG. 6 shows an estimate of the magnetic field profile 32 generated within the opening 34 by the above magnet assembly 12, both at the center of the imaging volume (0,0), as well as 1 cm offset in either direction along the longitudinal z-axis LZ through the opening 34. Furthermore, a graph of the estimated magnetic field profile 32 through the center of the imaging volume is also shown.

The desired magnetic field profile 36 inside the imaging volume within the opening 34 of the body 10 of the magnet assembly 12 can be selected based on any number of considerations known to persons skilled in the art. For example, a quadratic bowl magnetic field profile, shown in FIG. 7, which provides a reasonable balance between magnetic field strength and uniformity, can be used. As can be seen, at the center of the quadratic bowl magnetic field profile, magnetic field strength, $\|B\|$, reaches its lowest point, with progressively higher $\|B\|$ values closer to the periphery of the imaging volume. Preferably, $\|B\|$ along the longitudinal z-axis LZ of the opening will also be reasonably uniform, and not showing any change at positions offset from the center of the imaging volume along the z-axis LZ.

As can be seen in the graph in FIG. 6, there is reasonable agreement (i.e. to within 10 G) between the estimated field profile 32 and the desired magnetic field profile 36, particular along the y-axis. As discussed in more detail below, the sensitivity of the imaging radio-frequency (RF) coil 38 will require a particularly controlled magnetic field along the z-axis LZ.

Once the desired magnetic field profile 36 is selected, the estimated magnetic field profile 32 of a particular arrangement of permanent magnet segments 16 on the body 10 of the magnet assembly 12 is preferably compared to the desired magnetic field profile 36. In this regard, good results have been obtained using an eight-di-pole expansion, in which the pairs of permanent magnets 18 making up each permanent magnet segment 16 are simulated as a set of eight identical magnetic di-poles evenly spaced inside each of the permanent magnets volume. The time required to compute the estimated magnetic field profile 32 using the eight-dipole-expansion is on the order of a fraction of a second, which, when compared to commercially available finite element solvers, allows for the use of numerical optimization routines. However, there are several other ways for estimating the magnetic field profile of the permanent magnet segments 16 that will be available to persons skilled in the art, including for example, a finite element simulation discussed in Tony Tadic and B. Gino Fallone, "Design and Optimization of Superconducting MRI Magnet Systems With Magnetic Materials", (2012) IEEE Transactions on Applied Superconductivity, 22(2):4400107-4400107.

Figure 7:
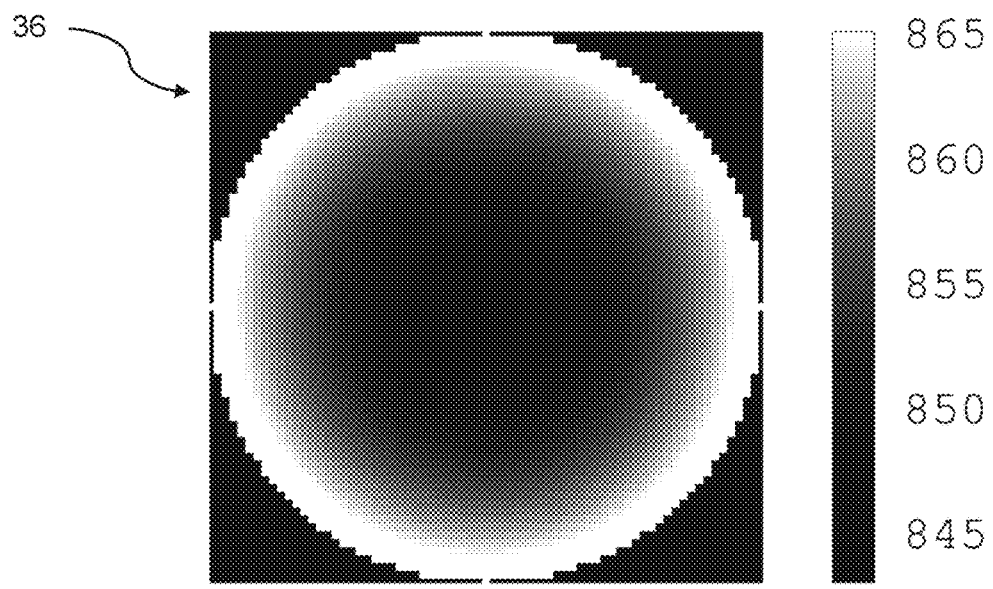
FIG. 7 shows an example of a desired quadratic bowl magnetic field profile.

A comparison of the estimated magnetic field profile 32 shown in FIG. 6 and the desired magnetic field profile 36 shown in FIG. 7, reveals that the above described magnet assembly 12 approximates the desired magnetic field profile 36 to a reasonable degree in the center two cm of the imaging volume. This has been found to be adequate since the receive coil 38 of the MRI instrument 14 in this example is only sensitive to about the center two cm of the imaging volume in the center of the opening 34 of the body 10 of the magnet assembly 12.

Example 2

Figure 8:
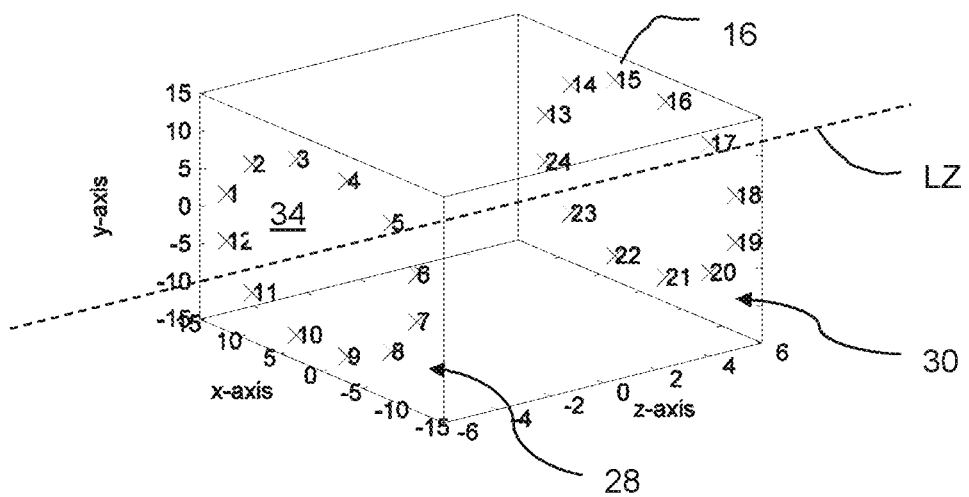
FIG. 8 shows center locations of 24 permanent magnet segments arranged in two rings according to another embodiment of the present invention.

In view of the above example, variants of the two ring magnet assembly will now be appreciated by persons skilled in the art. For example, FIG. 8 shows an arrangement of 12 permanent magnet segments 16 evenly spaced apart in each of two rings, for a total of 24 permanent magnet segments 16. The two rings of permanent magnet segments 16 are spaced apart from each other, with their center locations positioned on the longitudinal z-axis LZ of the opening 34. As above, each permanent magnet segment 16 preferably comprises a pair of permanent magnets 18 resulting in a total of 48 permanent magnets 18 being attached to the body 10 of the magnet assembly 12.

Figure 9:
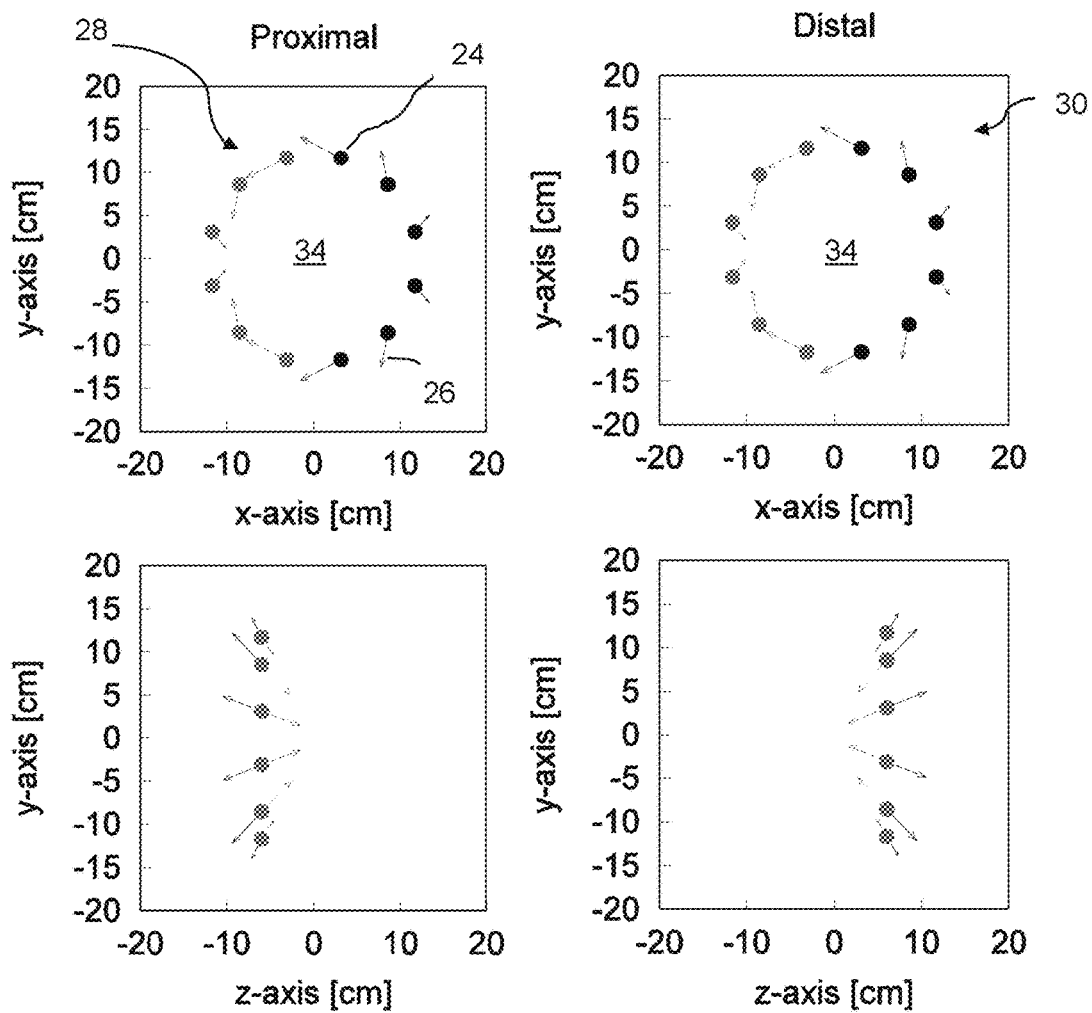
FIG. 9 shows magnetic field directions for the plurality of permanent magnet segments of FIG. 8 in y/x and y/z planes.

FIG. 9 shows the arrangement of the permanent magnet segments 16 in the two rings in terms of the positions of their center locations 24 and magnetization directions 26. As can be seen in the x/y graphs, the permanent magnet segments 16 define two rotations of the magnetization directions 26 in each of the two rings, which is consistent with the circular Halbach array, for example as shown in FIG. 1. However, the y/z graphs for the rings shows that the magnetization directions 26 of the permanent magnet segments 16 are oriented out of alignment with their respective rings. In other words, the magnetization directions 26 are out of alignment with a plane perpendicular to the longitudinal z-axis LZ, which is a surprising departure from the circular Halbach array.

Figure 10:
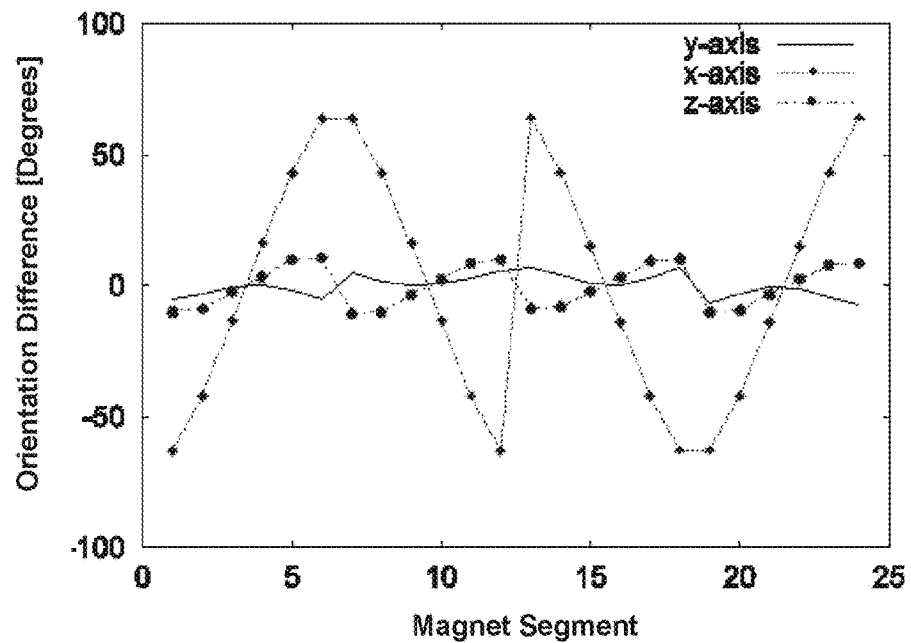
FIG. 10 shows a graph of the differences in the magnetization directions of the permanent magnet segments of FIG. 8 relative to magnetization directions of permanent magnets based on a circular Halbach array.

This departure from the circular Halbach array is more clearly seen in FIG. 10, which shows a graph of the differences between the magnetization directions 26 of a magnet assembly 12 having the permanent magnet segments 16 arranged with the magnetization directions 26 shown in FIG. 9, and a magnet assembly based on the circular Halbach array.

The permanent magnet segments 16 are attached to the body 10 to generate a magnetic field profile within the opening similar to the quadratic bowl magnetic field profile shown in FIG. 6, although with a weaker magnetic field strength.

Figure 11:
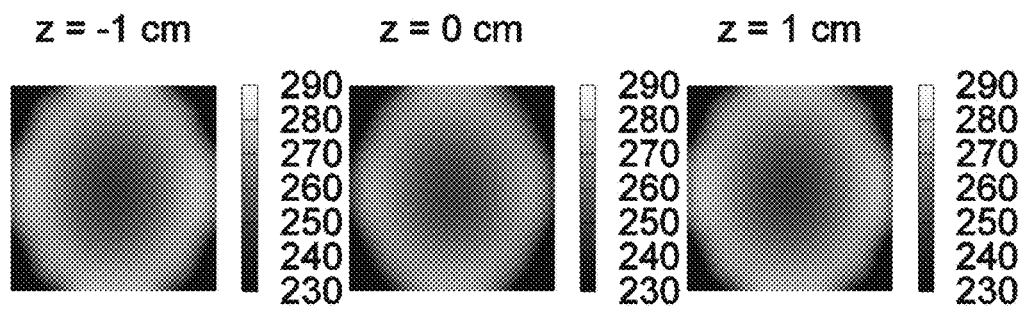
FIG. 11 shows estimated magnetic field profiles generated by the plurality of permanent magnet segments of FIG. 8 at z=−1 cm, z=0 cm and z=1 cm.
Figure 12:
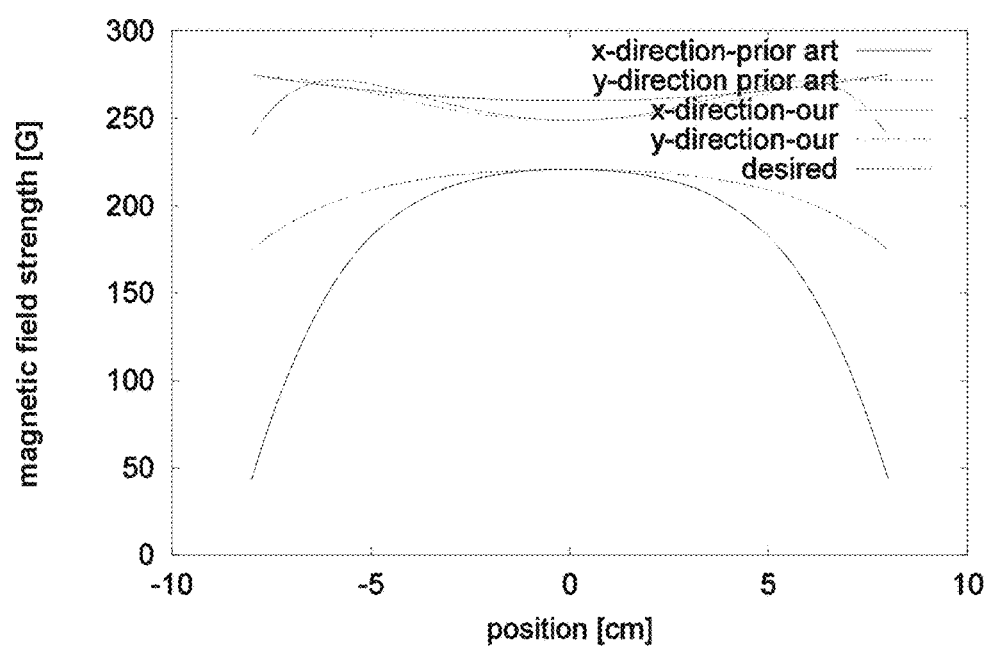
FIG. 12 shows a graph of the estimated magnetic field profile generated by the permanent magnet segments of FIG. 8 at z=0 and the desired magnetic field profile.

FIG. 11 shows the estimated magnetic field profile 32 generated within the opening 34 by the above magnet assembly 12, both at the center of the imaging volume, as well as 1 cm offset in either direction along the longitudinal z-axis LZ of the opening 34. FIG. 12 shows a graph of the estimated magnetic field profile 38 of a magnet assembly 12 having the permanent magnet segments 16 arranged with the magnetization directions shown in FIG. 9, as well as the desired magnetic field profile 32, and magnetic field profiles using prior art magnet arrangements based on the circular Halbach array, for comparison. As can be seen in FIG. 12, the magnet assembly 12 is estimated to generate a magnetic field profile having a center field of 240 G, which rises to about 270 G at the edges of the imaging volume. As can also be seen, there is good agreement (i.e. to within 20 G) between the estimated magnetic field profile and the desired magnetic field profile.

Example 3

Figure 13:
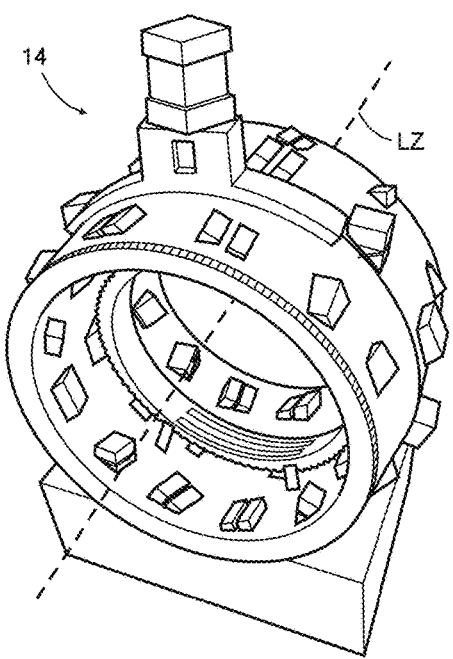
FIG. 13 shows a perspective view of an MRI instrument according to another embodiment of the present invention, including a magnet assembly comprising a body attaching a plurality of permanent magnet segments in a proximal ring, a center ring, and a distal ring.
Figure 14:
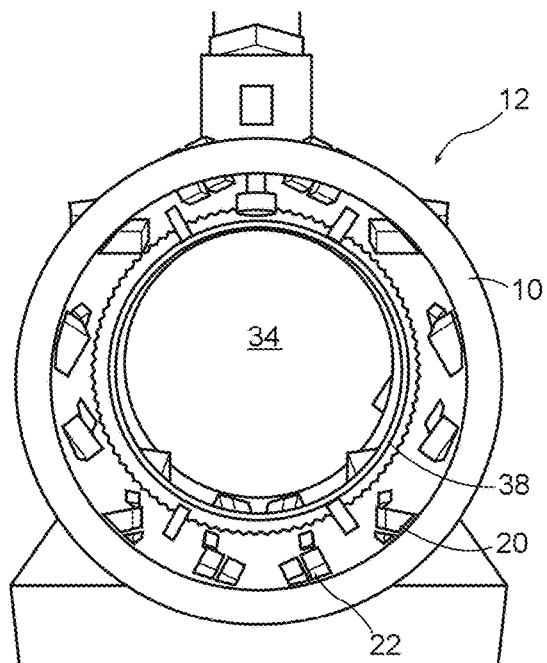
FIG. 14 shows a view of the proximal end of the MRI instrument of FIG. 13.
Figure 15:
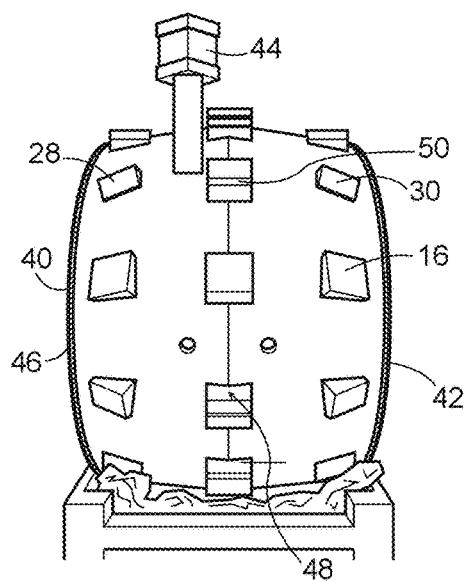
FIG. 15 shows a side view of the MRI instrument of FIG. 13.

Referring now to FIGS. 13 to 15, there is shown a magnetic resonance imaging (MRI) instrument 14 according to another embodiment of the present invention. The MRI instrument 14 includes a body 10 having an opening 34 from a proximal end 40 to a distal end 42 of the body 10. The body 10 is barrel-shaped, having an outside diameter of about 25.5 cm at the proximal and distal ends 40,42 of the opening 34, and 27.3 cm in the region between the proximal and distal ends 40,42. The wall of the body 10 is about 2.75 cm thick. A rotatable RF coil 38 is positioned in the opening 34 at the center of the body 10. The RF coil 38 has an internal diameter of about 18 cm, to provide a usable imaging volume of about 16 cm in diameter, which is adequate for imaging extremities such as legs, knees, ankles, feet, arms, elbows, wrists, and hands, etc. In the longitudinal z-axis LZ through the opening 34 of the body 10 of the magnet assembly 12, the usable slice thickness is about 2 cm, which may be imaged as one slice with a single RF coil, or simultaneously as a plurality of slices with multiple RF coils. For example, the 2 cm thick imaging volume may be simultaneously imaged using four RF coils each sensitive to a 5 mm slice of the 2 cm thick imaging volume. It will be appreciated that the entire magnet assembly 12 may be moved along the longitudinal z-axis LZ, in a known manner, if more coverage is needed.

Preferably, a stepper motor 44 is provided to engage and rotate the RF coil 38 in a known way. Additionally, the body 10 of the magnet assembly 12 may be provided with a set of gear teeth 16 to allow the body to be rotated with a motor having a matching gear (not shown).

As will be appreciated by persons skilled in the art, the MRI instrument 14 will include additional components such as one or more of a processor, a memory, an input means, and an output means as may be required to operate the MRI instrument to output magnetic resonance data of objects position in the imaging volume of the instrument, in a usable form.

36 permanent magnet segments 16, each with a magnetization direction 26, are arranged on the body 10 in each of a proximal ring 28, a distal ring 30, and a center ring 48 located between the proximal and distal rings 28,30. The permanent magnet segments 16 are evenly spaced from adjacent permanent magnet segments 16 in each of the respective proximal, center, and distal rings 18, 30, 48. The three rings of permanent magnet segments 16 are evenly spaced from each other, with their centers positioned on the longitudinal Z-axis LZ of the opening 34. Each permanent magnet segment 16 comprises a pair of permanent magnets 18 having the same magnetization directions 26. Although, the permanent magnet segments 16 are shown as comprising pairs of permanent magnets 18, it will be understood that the permanent magnet segments 16 may comprise one or more than two permanent magnets 18 having the same magnetization directions 26. Preferably, each of the pairs of permanent magnets 18 are held in magnet holders 20 on the body 10. Each magnet holder 20 has an attachment member 22 sized and shaped to permit a pair of the permanent magnets 18 to clamp to the attachment member 22 by the force of their magnetic attraction to one another. In this example, the attachment members 22 are 3 mm thick strips of plastic. It has been found that the clamping force of the permanent magnets 18 will hold them to the 3 mm thick attachment member 22 provided that adjacent permanent magnets 18 are spaced more than 3 mm apart. Additionally, 3 mm thick spacers 50 may be used in conjunction with the attachment members 22 maintain the spacing between the permanent magnets 18. Although, this example shows permanent magnet segments arranged in three rings, it is contemplated that additional rings of permanent magnet segments may be used to extend the magnetic field profile along the longitudinal z-axis LZ of the opening 34. For example, at least one additional pair of rings may be positioned outwardly of the three rings described above (not shown). All such embodiments are contemplated by the present invention.

Figure 17:
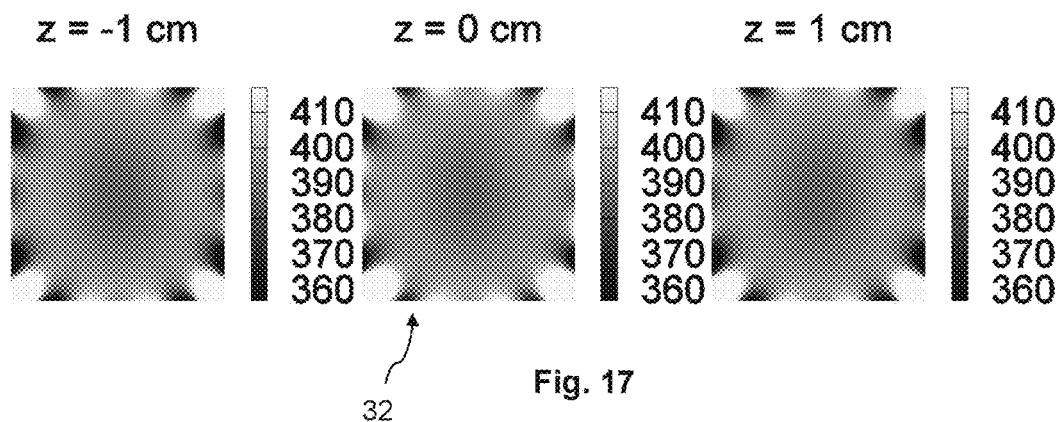
FIG. 17 shows estimated magnetic field profiles generated by the plurality of permanent magnet segments of FIG. 13 at z=−1 cm, z=0 cm and z=1 cm.

The permanent magnet segments 16 are attached to the body 10 to generate a magnetic field profile within the opening 34. FIG. 17 shows an estimate of the magnetic field profile 32 generated by the magnet assembly 12 using a multi-dipole expansion. As can be seen the estimated magnetic field 32 profile has a substantially constant magnetic strength along the center most 2 cm portion of the opening 34 along the longitudinal z-axis LZ of the opening 34. The estimated magnetic field profile 34 is also substantially uniform radially about the longitudinal z-axis LZ of the opening 34 in a plane perpendicular to the longitudinal z-axis LZ, over the 2 cm portion of the opening 34. As such, it is similar to the desired quadratic bowl magnetic field profile 36 shown in FIG. 7, although at a weaker magnetic field strength.

Figure 18:
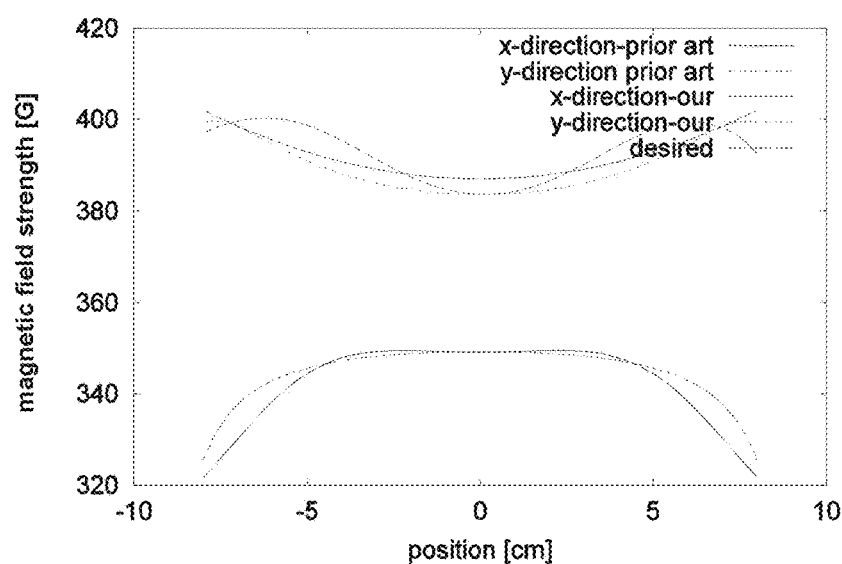
FIG. 18 shows a graph of the estimated magnetic field profile generated by the permanent magnet segments of FIG. 13 at z=0 and the desired magnetic field profile.
Figure 19:
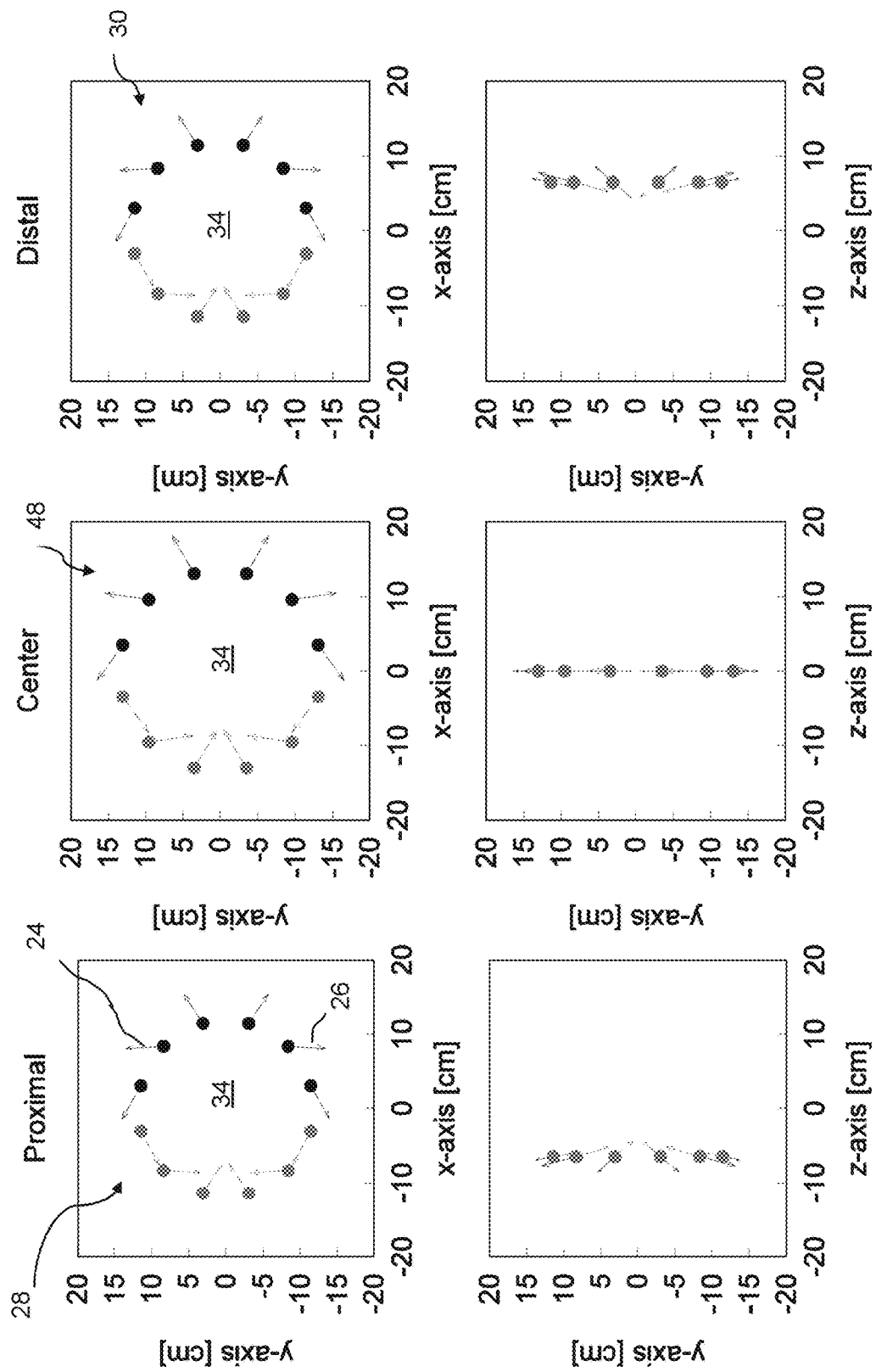
FIG. 19 shows magnetic field directions for the plurality of permanent magnet segments of FIG. 13 in y/x and y/z planes.

FIG. 18 shows a graph of the estimated magnetic field profile 32 of the magnet assembly 12 having the permanent magnet segments 16 arranged with the magnetization directions 26 shown in FIG. 19, as well as the desired magnetic field profile 36, and magnetic field profiles using prior art magnet arrangements based on the circular Halbach array, for comparison. As can be seen in FIGS. 17 and 18, the magnet assembly 12 is estimated to generate a magnetic field profile 32 having a center field of 380 G, which rises to about 400 G at the edges of the imaging volume.

FIG. 19 shows the arrangement of the permanent magnet segments 16 in the three rings on the body 10 in terms of the positions of their center locations 23 and magnetization directions 26 to generate the desired quadratic bowl magnetic field profile 36. As can be seen in the x/y graphs, the permanent magnet segments 16 define two rotations of the magnetization directions 26 in each of the three rings 28, 48, 30, which is consistent with the circular Halbach array. The y/z graph for the center ring 48 also shows that the magnetization directions 26 are aligned with the ring, which is also consistent with the circular Halbach array. However, the y/z graphs for the proximal and distal rings 28,30 show that the magnetization directions 26 of the permanent magnet segments 16 are oriented out of alignment with their respective rings. In other words, the magnetization directions 26 are out of alignment with a plane perpendicular to the longitudinal z-axis LZ, which is a surprising departure from the circular Halbach array, for example as shown in FIG. 1.

Figure 20:
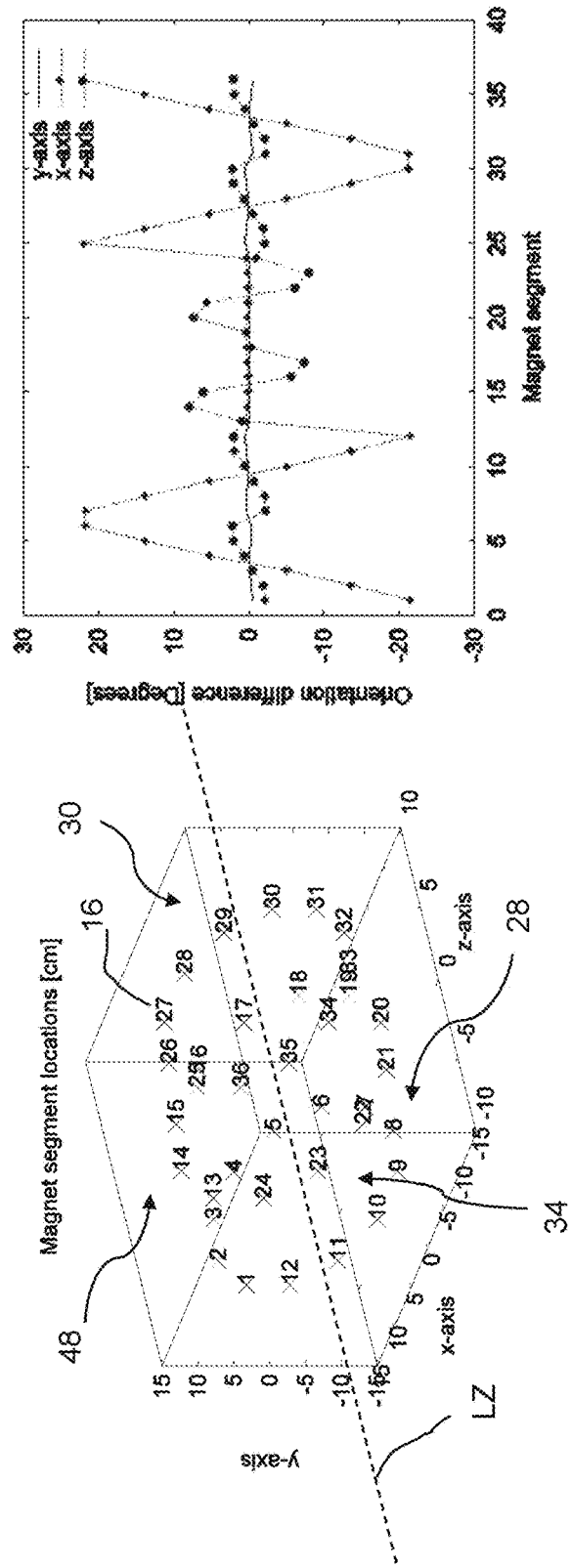
FIG. 20 shows center locations of the plurality of permanent magnet segments of FIG. 13 on the left, and on the right a graph of the differences in the magnetization directions of the permanent magnet segments of FIG. 13 relative to magnetization directions of permanent magnets based on a circular Halbach array.

This departure from the circular Halbach array is more clearly seen in FIG. 20, which shows the center locations of each of the permanent magnet segments 16 on the left, and on the right, a graph showing the differences between the magnetization directions of a magnet assembly 12 having the permanent magnet segments 16 arranged with the magnetization directions 26 shown in FIG. 19, and a magnet assembly based on the circular Halbach array. As can be seen, the differences in angles of the magnetization directions are most pronounced in the X and y axis.

Figure 16:
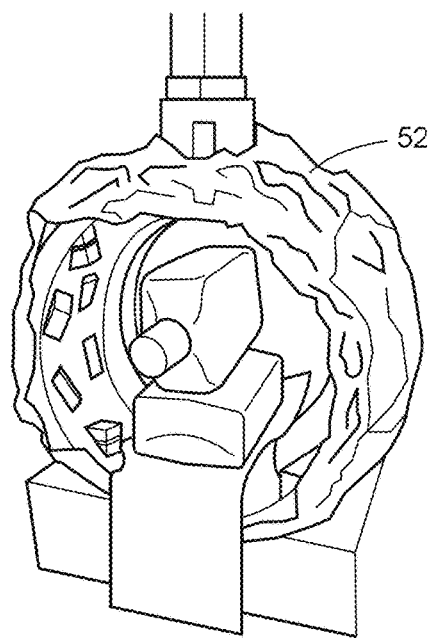
FIG. 16 shows a perspective view of the MRI instrument of FIG. 13 in use and including an RF shield made from aluminum.

Since the MRI signal is typically weak, an RF shield 52 may preferably be used to enclose the magnet assembly 12 to reduce interference from unwanted RF sources, as shown in FIG. 16. Good results have been obtained using an RF shield 52 made from aluminum. While typically in an MRI suite, the entire room is shielded, for portability reasons, it is more practical to shield the magnet assembly 12, and placing the RF shield 52 on the outside of the magnet assembly 12 provides a reasonable balance between ensuring sufficient shield effectiveness and avoiding interference with the RF coil 38, since a grounded RF shield in close proximity to a coil can significantly affect its operation.

Figure 21:
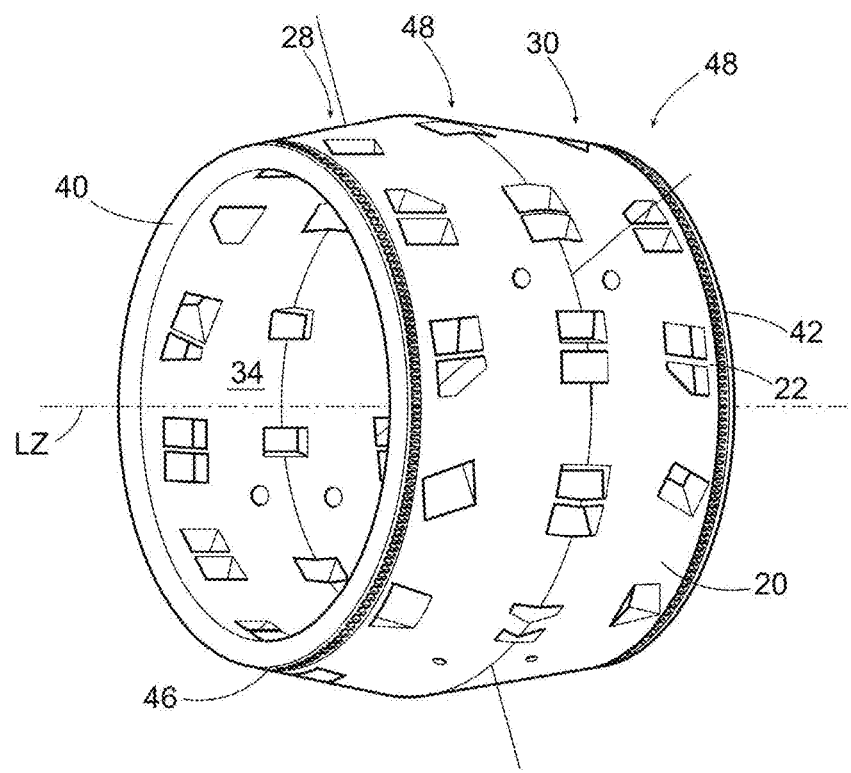
FIG. 21 shows a magnet assembly comprising 36 magnet holders for attaching a plurality of permanent magnet segments arranged in 3 rings according to another embodiment of the present invention.

As in the case of the first and second examples above, the body 10 of the magnet assembly 12 in this third example may be made from plastic (such as for example Polylactic acid) by 3D printing. By way of example, FIG. 21 shows a one piece 3D printed body 10. However, it will be appreciated that the body 10 of the magnet assembly 12 may be made by other methods available to the person skilled in the art.

Example 4

A problem with using a quadratic bowl magnetic field profile of the type shown in FIG. 17, is that the derivative of the magnetic field strength vanishes in the center. This results in undesired artifacts in the image at the center, which makes it difficult to accurately determine where the magnetic resonance signal is coming from in the center of the imaging volume. The applicant has overcome this problem by arranging the permanent magnet segments 16 on the body 10 of the magnet assembly 12 to generate a linear magnetic field profile 54, which has a substantially constant magnetic strength along a portion of the opening 34 along the longitudinal z-axis LZ, and is substantially non-uniform radially about the longitudinal z-axis LZ in a plane perpendicular to the longitudinal z-axis LZ, along the portion of the opening

Figure 22:
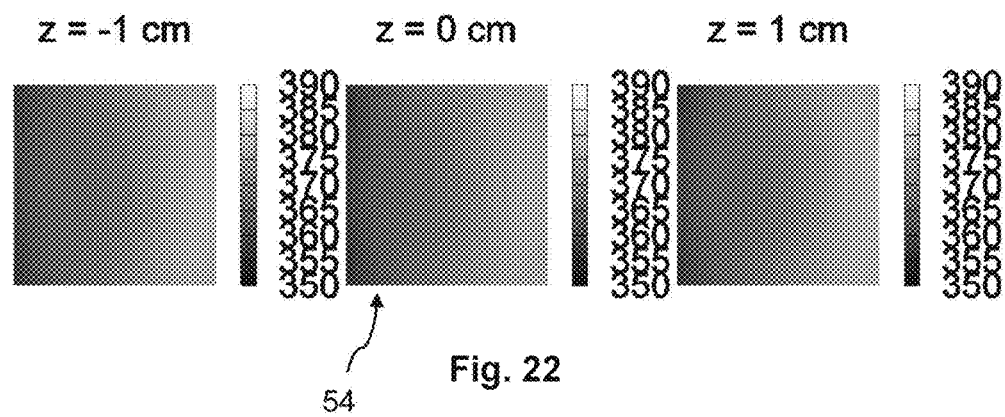
FIG. 22 shows estimated magnetic field profiles generated by the plurality of permanent magnet segments of FIG. 21 at z=−1 cm, z=0 cm and z=1 cm.
Figure 23:
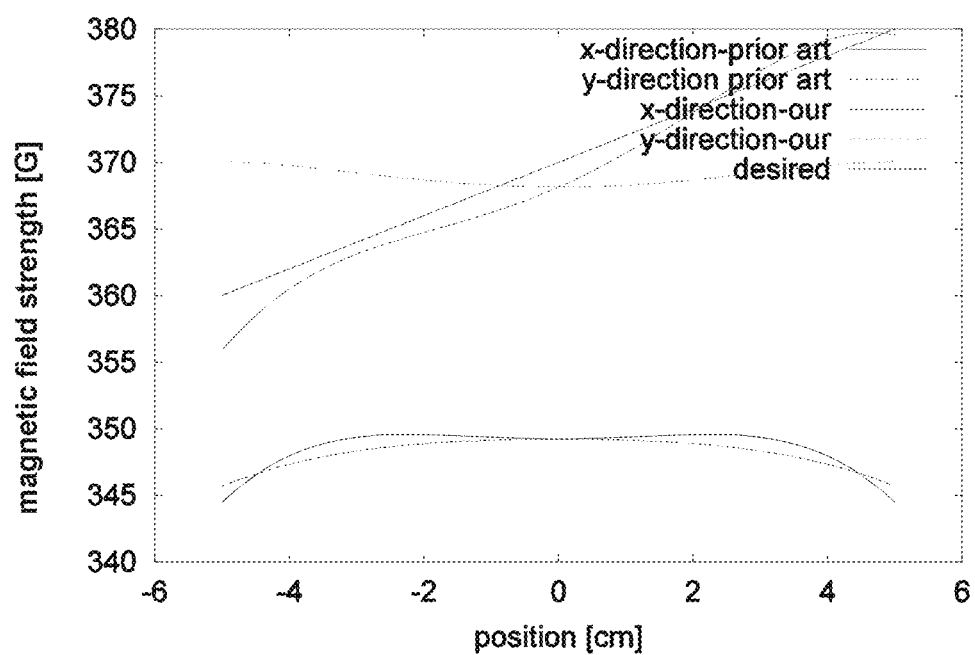
FIG. 23 shows a graph of the estimated magnetic field profile generated by the permanent magnet segments of FIG. 21 at z=0 and the desired magnetic field profile.

34. For example, as shown in FIGS. 22 and 23, the linear magnetic field profile 54 may increase in strength from the left side of the opening 34 to the right side (i.e. along the x-axis, which is perpendicular to the longitudinal z-axis LZ through the opening 34). Although the linear magnetic field profile 54 has a reduced imaging area, (i.e. 10 cm diameter compared to 16 cm diameter), and slightly reduced magnetic strength in the center of the imagine volume (i.e. 370 G vs 380 G), it can make it easier to determine accurately where the magnetic resonance signal is coming from in the center of the imaging volume, as compared to the quadratic bowl magnetic field profile 36.

Figure 24:
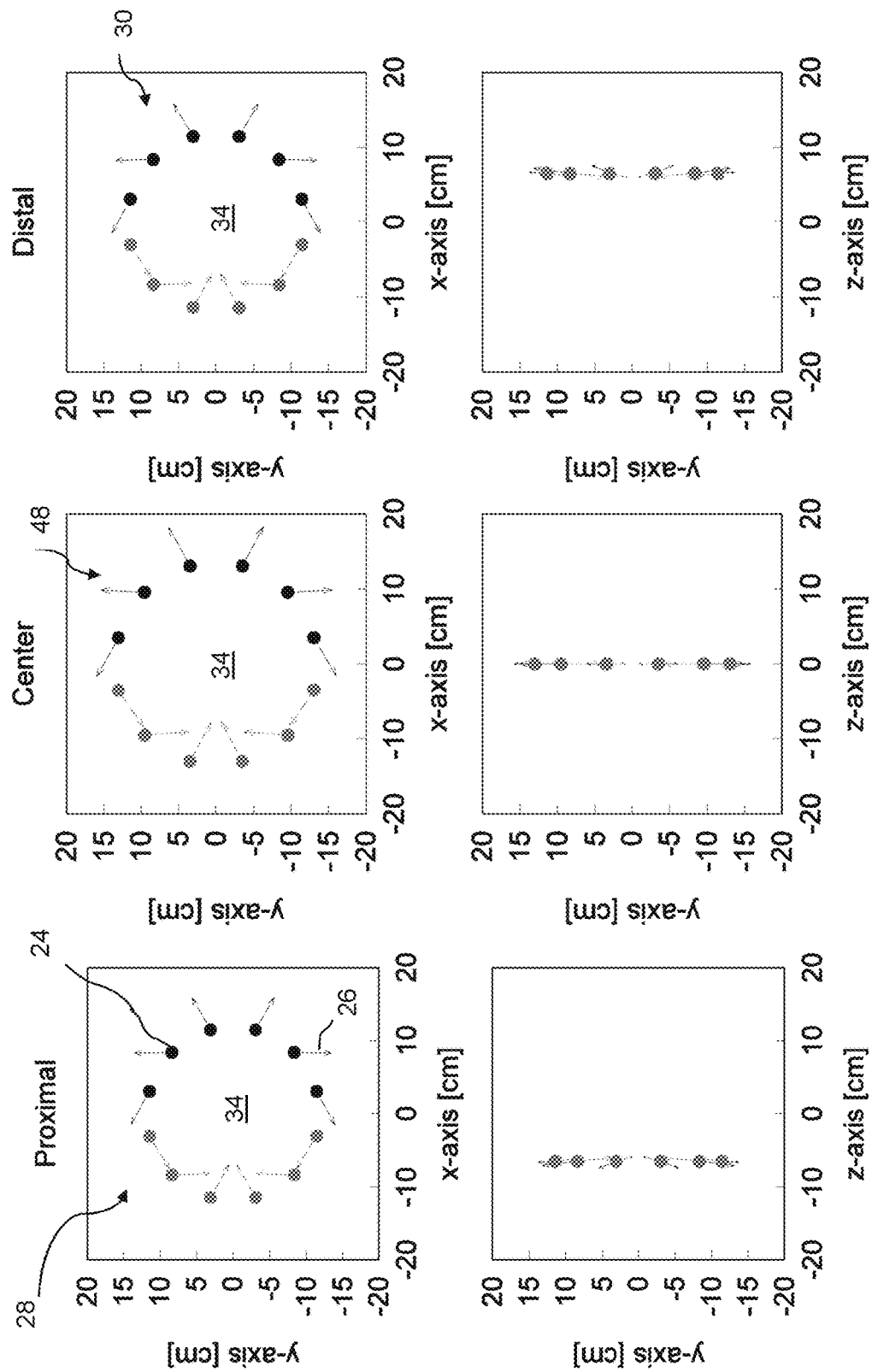
FIG. 24 shows magnetic field directions for the plurality of permanent magnet segments of FIG. 21 in y/x and y/z planes.

FIG. 24 shows the arrangement of the permanent magnet segments 16 in the three rings on the body 10 in terms of the positions of their center locations 24 and magnetization directions 26 to generate the linear magnetic field profile 54. As can be seen in the x/y graphs, the permanent magnet segments 16 define two rotations of the magnetization directions 26 in each of the three rings, which is consistent with the circular Halbach array. The y/z graph for the center ring 48 also shows that the magnetization directions 26 are aligned with the ring, which is also consistent with the circular Halbach array. However, the y/z graphs for the proximal and distal rings 28,30 shows that the magnetization directions 26 of the permanent magnet segments 16 are oriented out of alignment with their respective rings. In this respect, the magnetization directions 26 of the permanent magnet segments 16 are substantially the same in the x/y and y/z planes for the linear magnetic field profile 54 in this example 4, as compared to the quadratic bowl magnetic field profile 36 in example 3 discussed above. The difference is more evident in FIG. 25, which shows in the top set of diagrams the magnetization directions 26 for generating the quadratic bowl magnetic field profile 36, and in the bottom set the magnetization directions 26 for generating the linear magnetic field profile 54 in the z/x plane. As can be seen, the linear magnetic field profile 54 may be generated by orienting some of the magnetization directions 26 of permanent magnet segments 16 in the proximal and distal rings 28,30, in one region of the magnet assembly 12, away from the center of the imaging volume. For example, comparing the graphs of the magnetization directions 26 in the proximal ring of the quadratic magnet assembly (FIG. 25, top, left) to those of the linear magnet assembly (FIG. 25, bottom, left) reveals that the magnetization direction 26 of the leftmost 56 permanent magnet segment 16 is turned out more from the 0,0 point in the linear magnet assembly. The same is true for the leftmost magnet in the distal ring 30, which also shows the magnetisation direction 26 of the leftmost 56 permanent magnet segment 16 being turned out more from the 0,0 point in the linear magnet assembly.

It is also contemplated that a linear magnetic field profile may be generated by orienting some of the magnetization directions 26 of permanent magnet segments 16 in the proximal and distal rings 28,30, in one region of the magnet assembly toward the center of the imaging volume.

It is also contemplated that a linear magnetic field profile may be generated by orienting some of the magnetization directions 26 of permanent magnet segments 16 in the proximal and distal rings 28,30, in one region of the magnet assembly away from the center of imaging volume, and in an opposite region of the magnet assembly, toward the center of the imaging volume.

Figure 25:
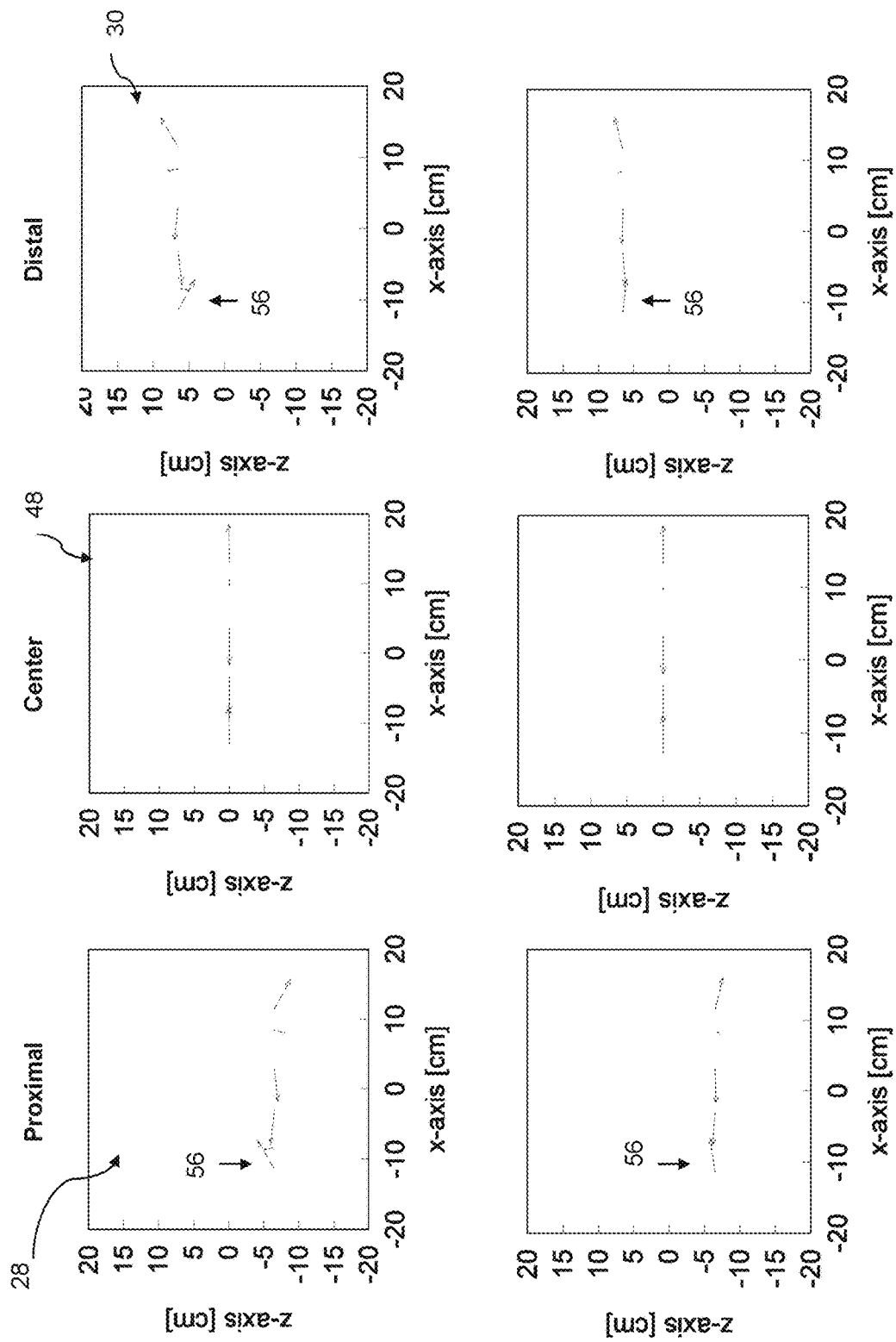
FIG. 25 shows at the top the magnetic field directions for the plurality of permanent magnet segments of FIG. 13 in the z/x plane, and at the bottom the magnetic field directions for the plurality of permanent magnet segments of FIG. 21 in the z/x plane.
Figure 26:
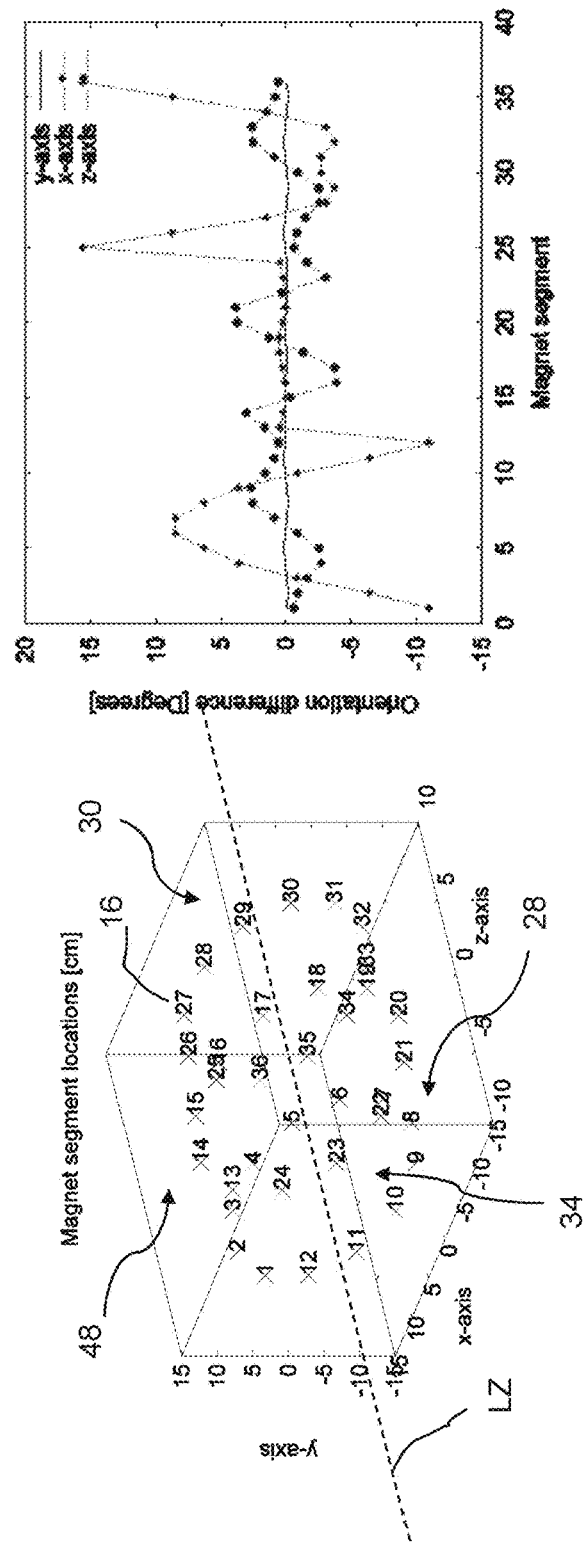
FIG. 26 shows center locations of the plurality of permanent magnet segments of FIG. 21 on the left, and on the right a graph of the differences in the magnetization directions of the permanent magnet segments of FIG. 21 relative to magnetization directions of permanent magnets based on a circular Halbach array.

This departure from the circular Halbach array is more clearly seen in FIG. 26, which shows the positions of each of the permanent magnet segments 16 on the left, and on the right, a graph showing the differences between the magnetization directions 26 of a magnet assembly 12 having the permanent magnet segments 16 arranged with the magnetization directions 26 shown in FIGS. 24 and 25, and a magnet assembly based on the circular Halbach array. As can be seen, the differences in angles of the magnetization directions 26 are most pronounced in the X and y axis. Furthermore, the differences are most significant around permanent magnet segments 16 numbered 1, 6, 12 and 25, 30 and 36. This is because those magnet locations correspond to the proximal and distal rings 28,30 on the extreme x-axis, where the linear magnetic field profile 54 is dramatically different from the quadratic magnetic field profile 26.

Determining Magnetization Directions

Figure 27:
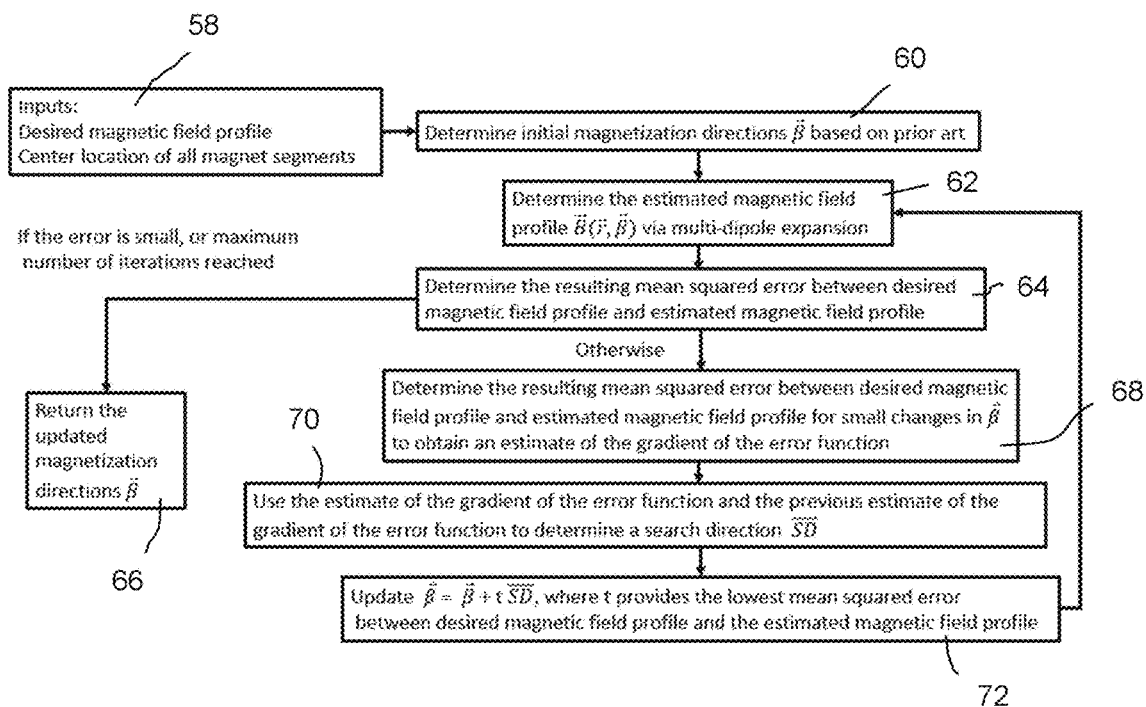
FIG. 27 shows a method for determining magnetization directions for a plurality of permanent magnets according to another embodiment of the present invention.

With reference to FIG. 27, the following describes a preferred method for determining the magnetization directions for a magnet assembly according to Examples 1 to 4 above.

As indicated in block 58, a desired magnetic field profile is selected. The desired magnetic filed profile can be any magnetic filed profile. By way of example, where a constant uniform field of 400 G is desired, the desired field profile may simply be represented by the formula:

$$\vec{B}_d(\vec{r})=400,$$

for all $\vec{r}$ inside the imaging area.

As another example, the following formula represents a quadratic bowl magnetic field profile 36:

$$\vec{B}_d(\vec{r})=\vec{r}^T A \vec{r}+\vec{B}_{center},$$

where $\vec{B}_d(\vec{r})$ is the desired magnetic field profile at a spatial location $\vec{r}$, at the center of the imaging volume $\vec{r}=0$, A is a 3×3 matrix with coefficients that define how quadratic the desired magnetic field profile should be, such as for example:

$$A = \frac{B_{edge}}{r_{edge}^2}\begin{bmatrix} 1 & 0 & 0 \\ 0 & 1 & 0 \\ 0 & 0 & 0 \end{bmatrix},$$

where $B_{edge}$ is the desired field increment at the edge over the center (for example 15 G), and $r_{edge}$ is the radius of the circular imaging area.

As another example, the following formula represents a linear magnetic field profile 54:

$$\vec{B}_d(\vec{r})=\vec{a}\cdot\vec{r}+\vec{B}_{center},$$

where $\vec{B}_d(\vec{r})$ is the desired magnetic field profile at a spatial location $\vec{r}$, at the center of the imaging volume $\vec{r}=0$, but now $\vec{a}$ is a vector that controls the linear slope (in all three dimensions) of the desired field, such as for example:

$$\vec{a} = \frac{B_{edge}}{r_{edge}^2}[1\ 0\ 0]^T,$$

where $B_{edge}$ is the desired field increment at the edge over the center (for example 10 G), and $r_{edge}$ is the radius of the circular imaging volume. Regardless of how the desired magnetic field profile is determined, good results have been obtained by using an iterative process, whereby minor revisions to the parameters are made resulting in a the desired magnetic field profile having a reasonable balance between magnetic field strength and uniformity.

The center locations of each of a plurality of permanent magnet segments 16 evenly spaced apart from one another in each of at least two spaced apart rings centered on a longitudinal z-axis LZ are also determined in block 58. Preferably, the same number of permanent magnet segments are arranged in each of the at least two rings. Preferably, the rings are sized to accommodate a desired imaging volume, as well as the RF 38 coil and support structures that need to be fit between the imaging volume and the ring. For example, the RF coil 38 may require an annular space of about 5-6 cm thick extending between the imaging volume and the center most ring of permanent magnet segments 16, if the center ring is present. Preferably, the permanent magnet segments 16 are positioned as close as possible to the imaging volume.

Preferably, the diameter of the outermost rings may be reduced compared to the center ring, if provided, to increase the magnetic field strength in the center of the imaging volume and/or increase homogeneity. By way of example, good results have been obtained by determining the diameter of outer rings (d) at a z-coordinate of z with the following formula:

$$\alpha^2 = 2\sqrt{\frac{1}{4}d_c^2 - \alpha z^2},$$

where $d_c^2$ is the diameter of the center ring and $\alpha$ is a number less than or equal to 1. Good results have been obtained with $\alpha$ being set to 1. However, in larger magnet assemblies, setting $\alpha$ to a number less than 1 may be necessary as the smaller diameter of the outer rings limits the size of the object that can be placed within the magnet assembly 12.

By way of example, in Example 3 above, the formula (with $\alpha=1$) results in the proximal and distal rings 28,30 having a diameter of 23.6 cm, when the center ring 48 has a diameter of 27 cm, and provides an imaging volume of about 16 cm in diameter, which is adequate for imaging extremities, such as a legs, knees, ankles, feet, arms, elbows, wrists, and hands. To image larger anatomical structures such as the brain, the rings would need to be sized with a larger diameter to accommodate an imaging volume of at least a 26 cm in diameter.

Once the center locations for all of the permanent magnet segments 16 have been determined, the next steps are used to determine their magnetization directions to achieve the best match to the desired magnetic field profile.

At box 60, an initial magnetization direction is determined for each of the permanent magnet segments 16 based on a circular Halbach array arrangement, which as mentioned above has all of the magnetization directions 26 aligned with a plane defined by the ring, and progressively make two rotations through adjacent permanent magnet segments 16 in one direction of the ring. In other words, the magnetization directions 26 only rotate around the center of the ring, and the other two rotation angles are set to zero.

Next, at box 62 an estimate is made of the magnetic field profile based on the initial magnetization directions, preferably using a multi-dipole expansion, which has shown good agreement (to within 1 G) of data acquired with a Gauss-meter.

For each permanent magnet segment, the orientation angles ($\vec{\beta}$) are converted into directional vectors. More preferably, the orientation angles ($\vec{\beta}$) for each permanent magnet of the permanent magnet segments are converted into directional vectors. The directional vectors are then split eight dipole's four for each permanent magnet. The four dipoles for each permanent magnet are then spaced uniformly within the permanent magnet. The dipole orientation vector ($\vec{m}$) is aligned with the directional vector for the permanent magnet, and its magnitude is a constant, carefully calibrated using gauss-meter measurements. Preferably the magnitude of the dipole orientation vector is re-calibrated later, once MRI data is available, to correct for minor variations (i.e. <1%) in the magnetic field strength of the permanent magnets. While more than eight diploes per magnetic block would have increased precision, computation time would have also increased.

The magnetic field profile $\vec{B}(\vec{r},\vec{\beta})$ was estimated by adding up all the subfields from all of the di-poles within all of the permanent magnets using the following formula:

$$\vec{B}(\vec{r},\vec{\beta}) = \frac{\mu_0}{4\pi}\sum_{i=1}^{N}\sum_{j=1}^{N}\left(\frac{3(\vec{r}-\vec{c}_{i,j})\vec{m}_{i,j}\cdot(\vec{r}-\vec{c}_{i,j})}{\|\vec{r}-\vec{c}_{i,j}\|^2} - \frac{\vec{m}_{i,j}}{\|\vec{r}-\vec{c}_{i,j}\|^2}\right),$$

wherein $\vec{m}_{i,j}$ is the dipole orientation vector from the j-th dipole for the i-th permanent magnet, $\vec{c}_{i,j}$ is the center location for the j-th diple for the i-th permanent magnet, $\vec{r}$ is the spatial location where the magnetic field profile is being estimated, M is the number of di-poles per permanent magnet (i.e 8 in this example), and N is the number of permanent magnets. The $\|\ \|$ operator is the L2 vector norm, defined as $\|\vec{x}\|=\sqrt{\sum_{k=1}^{L}x_k^2}$, where L is the number of elements in the $\vec{x}$ vector, and $x_k$ is the $k^{th}$ element of the $\vec{x}$ vector.

Next a conjugate gradient algorithm is applied using the estimated magnetic field profile and the desired magnetic field profile to obtain updated magnetization directions 26 for each of the plurality of permanent magnets 16 to generate a magnetic field profile having an acceptable error to the desired magnetic field profile. Preferably the acceptable error is a least mean squared error. However, it is contemplated that other error functions may be used, such as for example the max-norm defined as $\|\vec{x}\|_{Max}=\max x_k$ (i.e. the largest element in the vector $\vec{x}$).

Boxes 64-72 in FIG. 27 set out the steps for applying the conjugate gradient algorithm. At box 64 a calculation is made of the mean squared error between the desired magnetic field profile and the estimated magnetic field profile based on the initial magnetization directions.

If the mean squared error is acceptable or the maximum number of iterations of the conjugate gradient algorithm has been reached, the updated magnetization directions are returned in box 66. Otherwise, the conjugate gradient algorithm continues at box 68 by determining the resulting mean squared error between the desired magnetic field profile and the estimated magnetic field profile for small changes in to obtain an estimate of the gradient of the error function.

What is considered an acceptable least mean squared error will be will be appreciated by persons skilled in the art. By way of example, good results have been obtained by setting the least mean squared error to $10^{-6}$, as this value is the square root of the minimum representable floating point number. However, in light of other errors inherent in the process of constructing the magnet assembly a lower value may be warranted, such as about $10^{-3}$. For maximum number of iterations, good results have been obtained using 10-100. However, the maximum number of iterations may be set to any number. The purpose of this limitation is to prevent the algorithm from continuing for a very long time making very minor adjustments to the magnetization directions.

Preferably, the gradient of the error function is computed numerically by applying a small increment Δ (i.e. 1.8°) to each of the orientation angles, then calculating how much the error changes using the formula:

$$\nabla f(\vec{\beta}) \approx \frac{1}{\Delta}\left| f\left(\vec{\beta} + \begin{bmatrix} \vdots \\ \Delta \\ \vdots \end{bmatrix}\right) - f(\vec{\beta}) \right|,$$

where $f(\vec{\beta})$ is the difference between the desired magnetic field profile (i.e. the gradient of the error function), and the estimated magnetic field defined as:

$$\|\vec{B}_d(\vec{r}) - \vec{B}(\vec{r},\vec{\beta})\|.$$

Once the gradient of the error function is determined, the search direction ($\overline{SD}$) is determined next at box 70. Preferably, the scalar beta is defined first using the following formula:

$$\text{beta} = \frac{\nabla f(\vec{\beta})^T \nabla f(\vec{\beta})}{\nabla f(\vec{\beta})_{Last}^T \nabla f(\vec{\beta})_{Last}},$$

where, $\nabla f(\vec{\beta})_{Last}$ is the gradient of the error function found in the previous iteration.

In the case of the first iteration, where there is no previous iteration, the scalar beta is set to zero. Then the search direction is selected as follows:

$$\overline{SD} = -\nabla f(\vec{\beta}) + \text{beta}\overline{SD}_{Last},$$

where $\overline{SD}_{Last}$ is the search direction from the last iteration.

Next at box 72 updated magnetization directions are obtained for each of the permanent magnets with the formula:

$$\vec{\beta} = \vec{\beta} + t\overline{SD},$$

where t provides the lowest mean squared error between the desired magnetic field profile and the estimated magnetic field profile.

The conjugate gradient algorithm then repeats with the updated magnetization directions obtained in box 72 being used in box 62 to determine the estimated magnetic field profile based on the updated magnetization directions.

Example 5

A conventional magnet assembly based on the circular Halbach array arrangement of permanent magnets generates a magnetic field profile, whose magnetic field is oriented from one side of the magnet to the other (as seen in FIG. 1, along the x-axis). However, conventional MRI superconducting systems have a different magnetic field orientation, going through the opening through the body (along the longitudinal z-axis LZ). On a MRI system level, this requires the use different RF signal detection methods.

In this example 5, there is described a magnet assembly 12 for generating a magnetic field profile 32 that is oriented through the opening 34 of the body 10 of the magnet assembly 12, which is compatible with conventional RF signal detection methods developed for superconducting MRI scanners.

Figure 28:
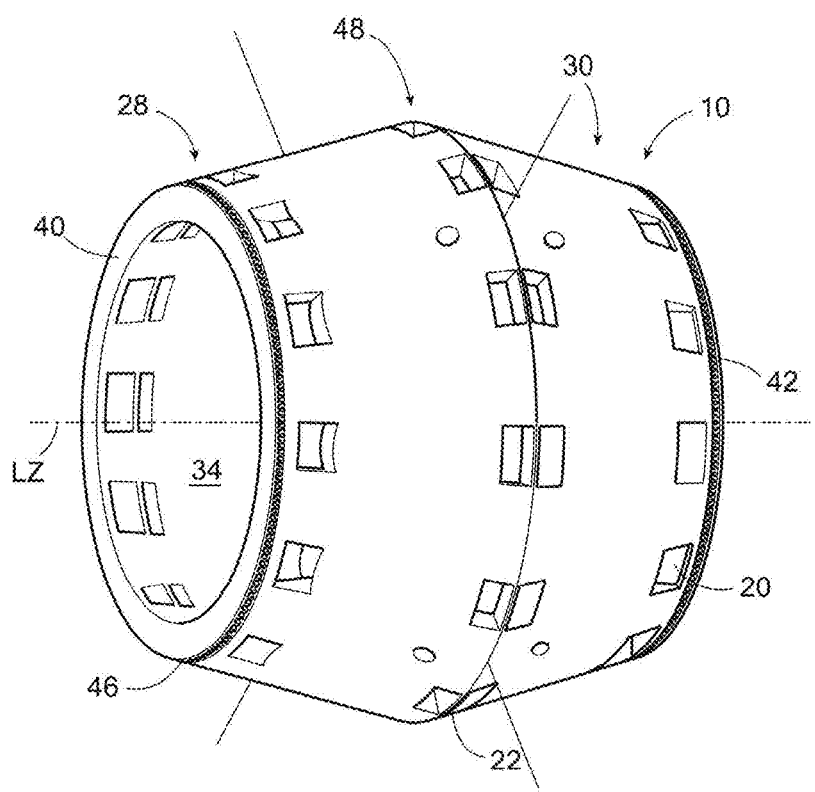
FIG. 28 shows a magnet assembly comprising 36 magnet holders for attaching a plurality of permanent magnet segments arranged in 3 rings according to another embodiment of the present invention.

FIG. 28 shows the body 10 of a magnet assembly 12 according to another embodiment of the present invention. The body 12 has an opening 34 from a proximal end 40 to a distal end 42 of the body 10. The body 10 includes magnet holders 20 for holding 36 permanent magnet segments 16, each with a magnetization direction 26, arranged on the body 10 in each of a proximal ring 28, a distal ring 30, and a center ring 48 located between the proximal and distal rings 28,30. The magnet holders 20 are arranged on the body 10 to hold the permanent magnet segments 16 evenly spaced from adjacent permanent magnet segments 16 in each of the respective proximal, center, and distal rings 28, 48, 30. The three rings are evenly spaced from each other, with their center locations 24 positioned on the longitudinal z-axis LZ of the opening 34 of the body 10 of the magnet assembly 12. Each magnet holder 20 is adapted to hold a pair of permanent magnet segments 16 having the same magnetization directions 26. Each magnet holder 20 has an attachment member 22 sized and shaped to permit a pair of the permanent magnets 18 to clamp to the attachment member 22 by the force of their magnetic attraction to one another. In this example, the attachment members 22 are 3 mm thick. It has been found that the clamping force of the permanent magnets 18 will hold them to the 3 mm thick attachment member 22 provided that adjacent permanent magnets 18 are spaced more than 3 mm apart.

Figure 29:
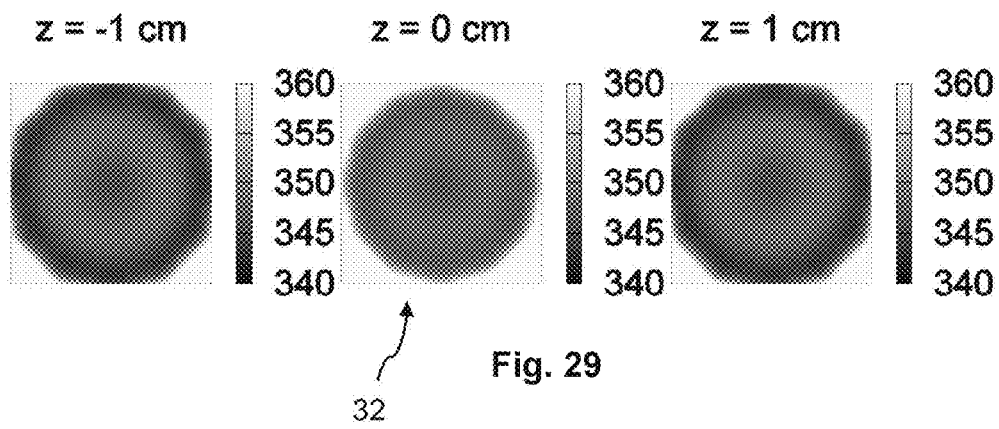
FIG. 29 shows estimated magnetic field profiles generated by the plurality of permanent magnet segments of FIG. 28 at z=−1 cm, z=0 cm and z=1 cm.

Preferably, the permanent magnet segments 16 are attached to the magnet holders 20 on the body to generate a magnetic field profile within the opening. FIG. 29 shows an estimate of the magnetic field profile 32 generated by the magnet assembly 12 using a multi-dipole expansion. As can be seen the estimated magnetic field profile 32 has a magnetic strength that uniformly increases, then uniformly decreases, along the center most 2 cm portion of the opening 34 along the longitudinal z-axis LZ. The estimated magnetic field profile is also substantially uniform radially about the longitudinal z-axis LZ in a plane perpendicular to the longitudinal z-axis LZ, over the 2 cm portion of the opening 34.

Figure 30:
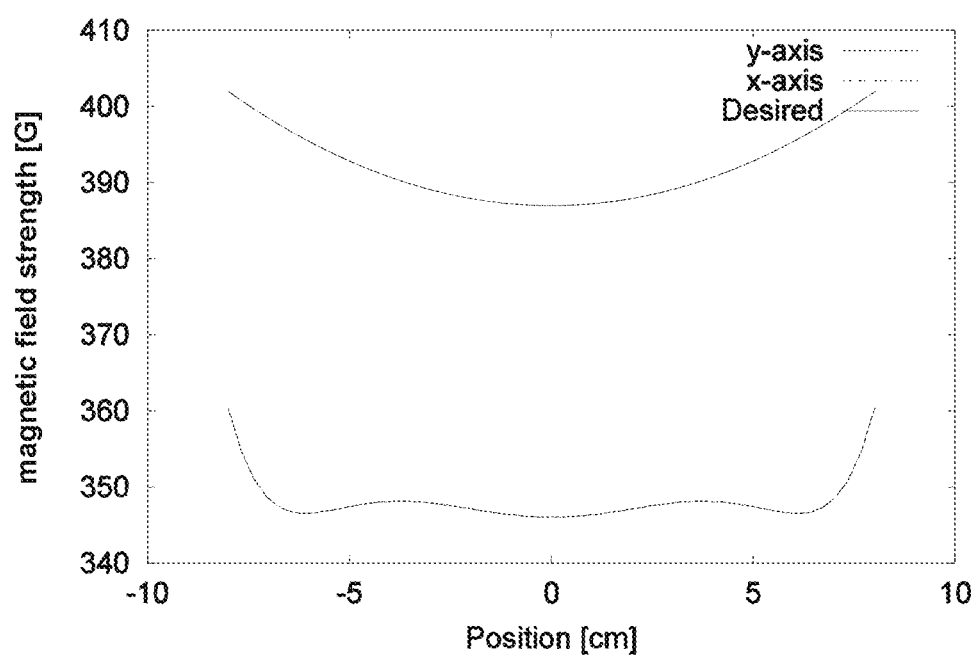
FIG. 30 shows a graph of the estimated magnetic field profile generated by the permanent magnet segments of FIG. 28 at z=0 and the desired magnetic field profile.

FIG. 30 shows a graph of the estimated magnetic field profile 32 of a magnet assembly 12 having the permanent magnet segments 16 arranged with the magnetization directions 26 shown in FIG. 35, as well as the desired magnetic field profile 36.

Figure 31:
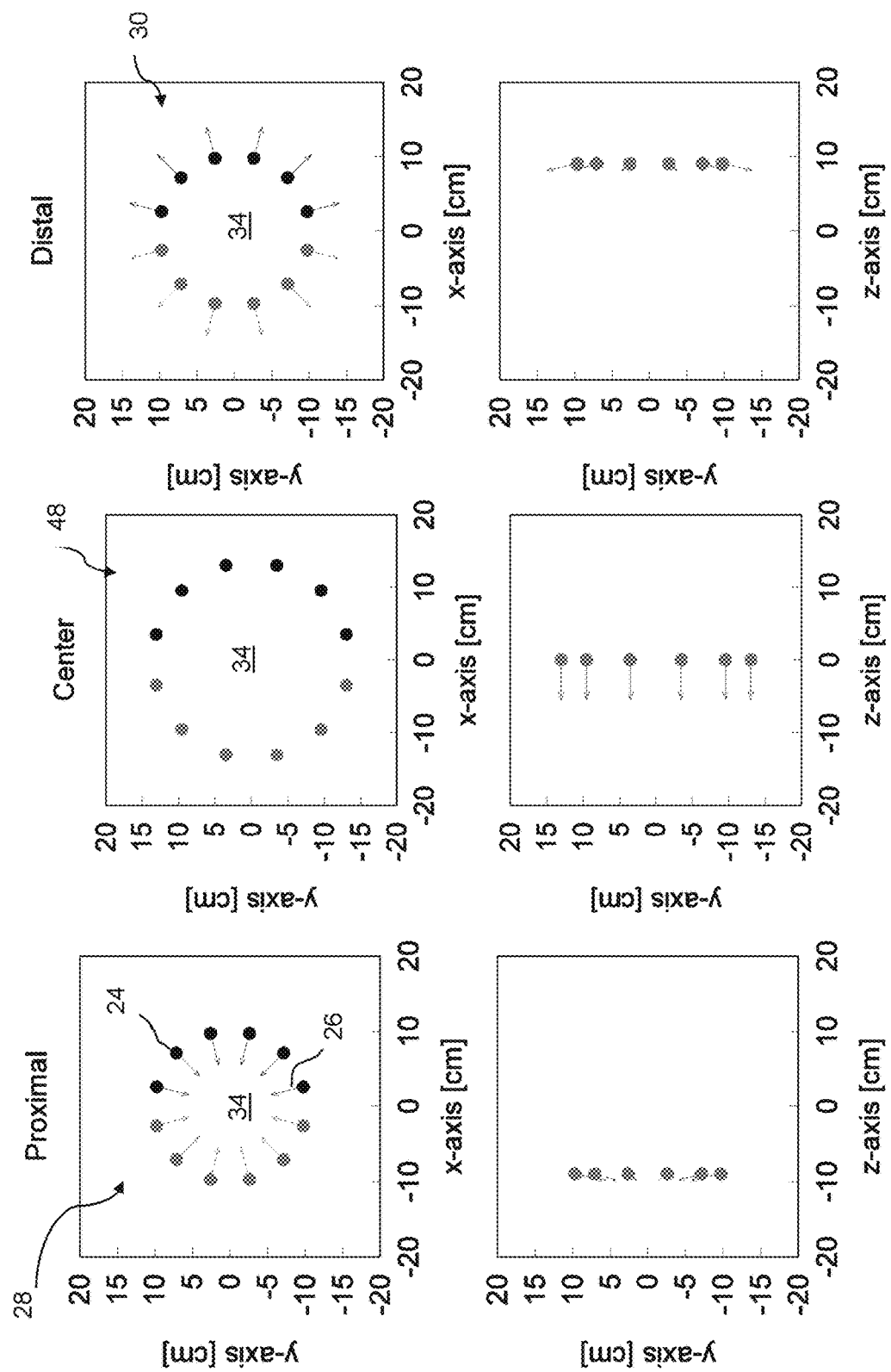
FIG. 31 shows magnetic field directions for the plurality of permanent magnet segments of FIG. 28 in y/x and y/z planes.

FIG. 31 shows the arrangement of the permanent magnet segments 16 in the three rings on the body 10 in terms of the center locations 24 of their positions and magnetization directions 26 to generate the quadratic bowl magnetic field profile 36. As can be seen in the x/y graphs, in the proximal ring 28, all of the permanent magnet segments 16 have their magnetization directions 26 oriented to point radially towards the longitudinal z-axis LZ at the center of the opening. The x/y graph of the center ring 48 shows the magnetization directions 26 of all of the permanent magnet segments 26 being parallel to the longitudinal z-axis LZ. The x/y graph of the distal ring 30 shows the magnetization directions 26 of all of the permanent magnet segments 16 being oriented to point radially away from the longitudinal z-axis LZ at the center of the opening 34 of the body 10 of the magnet assembly 12. The y/z graphs show the magnetization directions 26 of all of the permanent magnet segments 16 being oriented out of alignment with their respective rings, in the same direction, namely the proximal direction.

Figure 32:
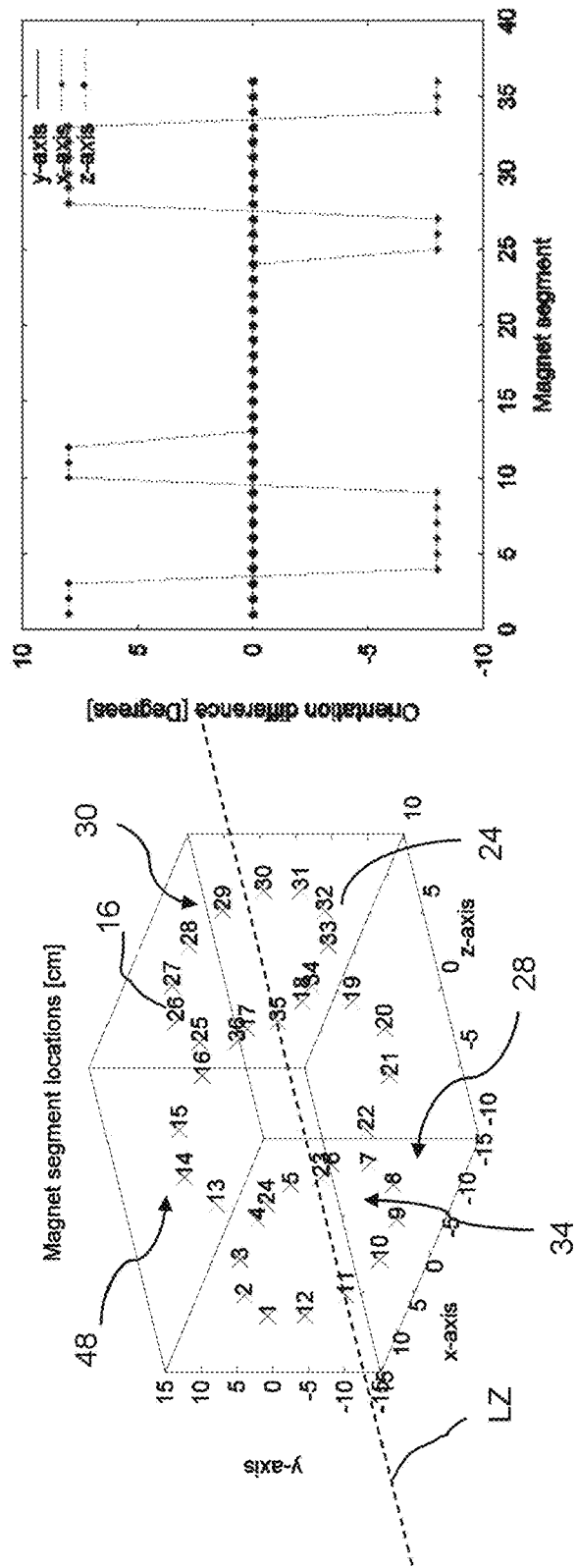
FIG. 32 shows center locations of the plurality of permanent magnet segments of FIG. 28 on the left, and on the right a graph of the differences in the magnetization directions of the permanent magnet segments of FIG. 28 relative to magnetization directions of permanent magnets based on a circular Halbach array.

FIG. 32, shows the positions of the center locations 24 of each of the permanent magnet segments 16 on the left, and on the right, a graph of the differences between the magnetization directions 26 of a magnet assembly 12 having the permanent magnet segments 16 arranged with the magnetization directions 26 shown in FIG. 31, and a magnet assembly based on the linear Halbach array. The linear Halbach array is radially symmetric, such that in the 3 ring example, it would consist of 3 blocks arranged as shown in FIG. 32 (middle).

As in the case of the first example above, the body 10 of the magnet assembly 12 in this example may be made from plastic by 3D printing. By way of example, FIG. 28 shows a one piece 3D printed body. However, it will be appreciated that the magnet holder may be made by other methods available to the person skilled in the art.

Determining Magnetization Directions

The following describes a preferred method for determining the magnetization directions 26 for a magnet assembly 12 according to Example 5 above.

In this example, a stronger magnetic field strength is sought inside the opening 34 of the magnet assembly 12 as compared to outside of the magnet assembly 12.

As shown in FIG. 33 the magnet holders 22 are positioned on the body 10 of the magnet assembly 26 to hold the permanent magnet segments 16 in three rings having their centers on the longitudinal z-axis LZ of the opening 34 of the body 10 of the magnet assembly 12. Initially the permanent magnet segments 16 have their magnetization directions 26 oriented in radially symmetric rows, such that in the center ring 48 they point opposite to the desired magnetic field direction, and in the proximal and distal rings 28,30 they point in opposite directions, perpendicular to the desired magnetic field direction, as shown in the middle of FIG. 33. As will be appreciated by persons skilled in the art, the initial magnetization directions are determined based on the linear Halbach array. The linear Halbach array uses a specific permanent magnet arrangement to focus the magnetic field to the one side of the magnet assembly. Expanding this concept radially allows for a stronger magnetic field inside the opening. The magnetic field is oriented along the longitudinal z-axis LZ.

Next the initial magnetization directions are adjusted as shown in the right of FIG. 33. The offset angle α is adjusted and the magnetic field is re-computed based on the updated magnetization directions using eight-di-pole expansion to estimate the magnetic field profile. The resulting estimated magnetic field profile 36 is then re-evaluated to determine which of the offset angles α to choose. The estimated magnetic field strength is computed at the center of the imaging volume within the opening 34, and the field inhomogeneity as a function for a range of offset angles α. By way of example, FIG. 34 shows a graph in which the magnetic field strength increases until it reaches a plateau at about 375 G as offset angles α increase from −60 to 20. Over the same offset angles α the field variation (inhomogeneity), calculated as (max(B)−min(B)), decreases from about 17 G to about 12 G and continues to rise to about 82 G as shown in FIG. 35. Based on these two graphs, it will be appreciated that an offset angle α of −8 degrees provides the strongest field with a field inhomogeneity of about 17 G. This field inhomogeneity is comparable to what is seen in the above examples. On a system level, a more homogeneous magnet assembly places less of a strain on the RF subsystem, hence a more homogenous magnet assembly is desirable. Good results have been obtained with inhomogeneities of about 20 G. Once the appropriate offset angle α is determined, it may be used to determine the updated magnetization directions for each of the permanent magnet segments 16.

Although the above example of the magnet assembly includes 3 rings of permanent magnet segments 16, it is contemplated that in other embodiments of the present invention the magnet assemblies 12 may contain two rings or more than three rings of permanent magnet segments. All such embodiments are contemplated by the present invention. Using more than three rings would require considering additional offset angles in the same manner described above with respect to the one offset angle α. However, as the number of offset angles increases to more than 3 or 4, it becomes impractical to exhaustively evaluate all combinations of offset angles as have been shown above with the single offset angle α. In such instances it becomes necessary to resort to a method similar to above where a conjugate-gradient algorithm is used to find the best combination of offset angles to generate a desired magnetic field profile.

Transmit and Receive Coil Design

Once placed in a magnetic field, protons start to interact with radio-waves. The frequency of these radio waves is proportional to the magnetic field strength. According to an embodiment of the present invention, for example, the field strength is 800 G, which corresponds to a frequency of 3.4 MHz. A good transmit and receive system is needed in order to interact with the protons and eventually construct an image. However, signal levels between transmit and receive are vastly different. This is especially true when as in the embodiments of the present invention, the field inhomogeneity is quite significant. Table 1 below summarizes the signal levels observed on several MRI platforms including an embodiment of the present invention.

TABLE 1

Transmit/receive power levels

| System | Field-strength [T] | Transmit (TX) signal | Recieve (RX) signal |
|---|---|---|---|
| GE Discovery 750 | 3.0 | 50 to 70 dBm | −50 to −30 dBm |
| Esaote C-Scan | 0.2 | 40 to 50 dBm | −70 to −50 dBm |
| MRI System according to an embodiment of the present invention | 0.08 | 30 to 40 dBm | −160 to −140 dBm |

All values in the above Table 1 are approximate based on experience and measurements. Actual signal levels will vary depending on measurement conditions (coil, objects in the imaging volume, pulse sequence, etc). All values are expressed in dBm (decibels relative to a mW). The comparatively low receive signal levels observed in the MRI system according to the embodiment of the present invention tested are due to the inhomogeneities inherent in the design, resulting in fewer protons being reachable at a given narrow frequency band, and hence less signal.

MRI scanners must thus employ some form of protection against transmit power levels seeping into the receive chain. Even in embodiments of the present invention, with a relatively modest 40 dBm peak power level, the corresponding RF power would easily ruin a sensitive low noise amplifier (LNA). The industry standard solution to this problem is to employ some form of a "blocking circuit".

Both passive and active schemes are typically employed, with careful diode arrangements drastically reducing the observed RX RF power during transmit. Unfortunately, for the purposes of the present invention, the recovery time from these blocking schemes, which can be on the order of a fraction of a millisecond, are much too slow. Due to the increased inhomogeneity in embodiments of the present invention, the received signal will have nearly completely dephased in a fraction of a millisecond.

Figure 36:
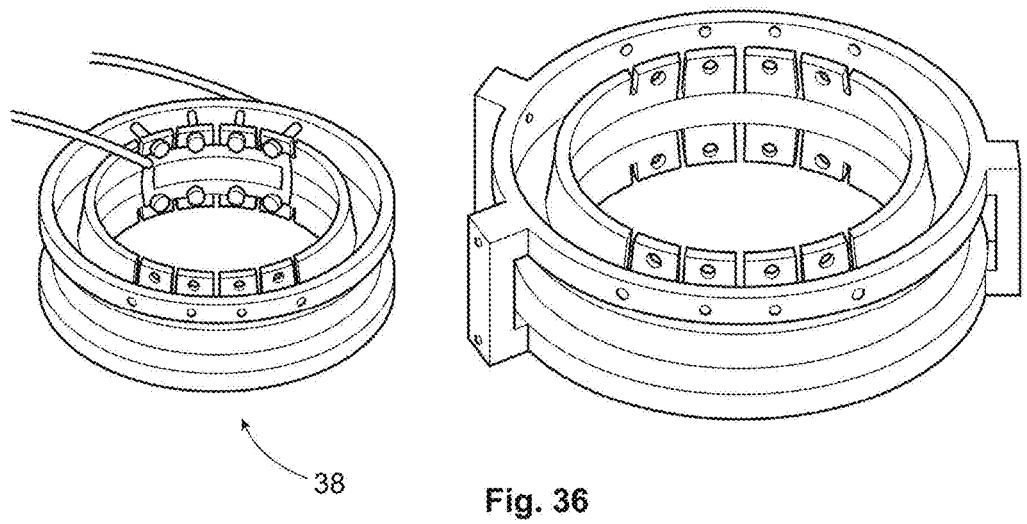
FIG. 36 shows at left a radio frequency (RF) coil including a support structure according to an embodiment of the present invention, and at right a cad drawing showing a perspective view of the support structure, in which flaps on the RX side are curved slightly inward, to achieve a greater range of positions by tightening the screw as needed to maximize TX-RX signal isolation.

Therefore a faster recovery solution is desired. Preferably, the MRI system according to the present invention may use two solutions to protect against transmit power levels seeping into the receive chain. The first solution is to utilize receive coils with small areas, therefore limiting exposure to the strong RF transmit field. The second solution is to place the RX coil symmetrically over the TX coil, and adding adjustment flaps to the receive coil. These small adjustment flaps allow the receive coil to be fine-tuned to minimize any TX field exposure. By carefully adjusting the screws on the RX coil structure shown in FIG. 36, its exact spatial position is carefully controlled. While the adjustment itself is relatively minor (often no more than a millimeter or two), the effect is quite substantial. Increasing the TX-RX signal isolation from 30 dB to 60 dB and beyond.

Thus the receive chain observes a much smaller peak RF power of −20 dBm, even though the actual transmit signal is at 40 dBm. Unlike the active/passive blocking approach, there is no transient period as the 60 dB level of isolation is always achieved. Furthermore, these two solutions are quite compatible, it would be easy to combine the two approaches in an embodiment that has active/passive blocking, in addition to the tunable, geometric scheme described above.

Figure 37:
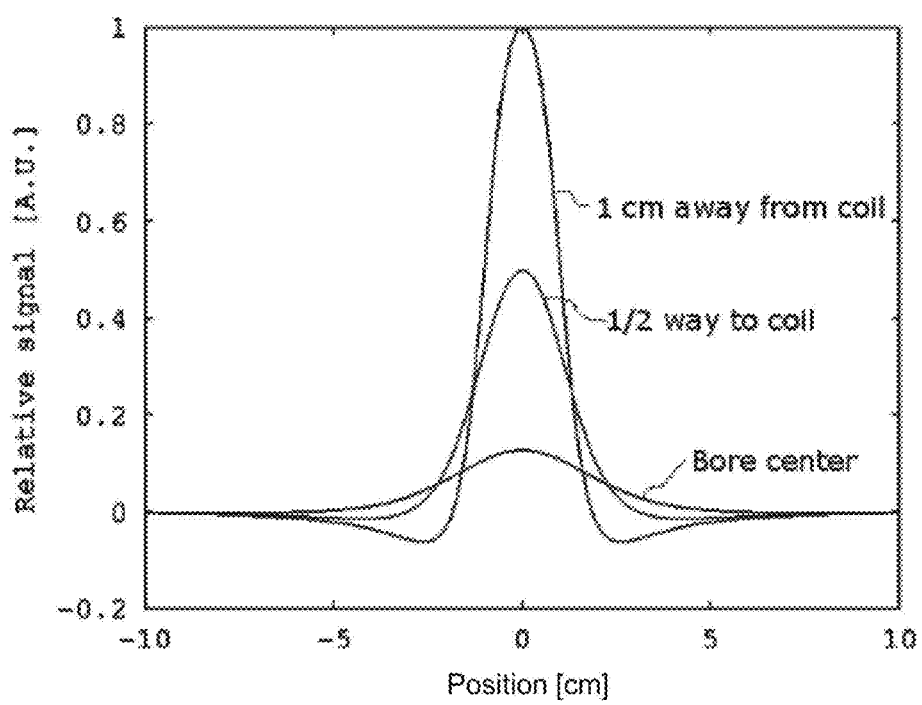
FIG. 37 shows the signal profile from the RF coil of FIG. 36, adapted for a target slice thickness of 2 cm, which is achieved close to the coil.

Another feature of the RF receive coil is that by shaping the RF receive coil the "slice-profile" of the coil can be altered, achieving slice selection with the RF RX coil. This greatly simplifies the reconstruction work, as the reconstruction engine needs only to reconstruct two dimensional images. If needed, information in the third dimension can be obtained by sliding the entire magnet/coil unit along the axis of the bore. However, other more scan-time efficient approaches are possible, by for example using a row of several coils along the bore axis akin to multi-detector CT systems. FIG. 37 illustrates the simulated RX coil profile.

RF Pulse Sequence Selection

The following will discuss two software components of the invention. First, the pulse sequence, which will use the hardware described above to query the hydrogen atoms in the imaging volume, thus gathering information that will be fed into the second component, namely the image reconstruction engine, which is described later. As mentioned above, the transmit power levels are much higher than those of the received signal, thus it is necessary to only transmit, or only receive during a given time period.

As is well known, when placed in a magnetic field, one can interact with the hydrogen atoms by use of radio-waves. The following equation determines the operating frequency, $$f = \gamma B,$$

where γ is the gyromagnetic ratio (42.58 MHz/T for hydrogen).

According to the present invention, the operating frequency will range a fair bit, as the magnet by design, has a field that varies from about 800 G to 860 G. Therefore the preferred operating frequency varies from 3.4 MHz to 3.6 MHz. One possible option is simply to design an RF pulse that is reasonably uniform over the entire band (Bernstein et al. "Handbook of MRI pulse sequences" Elsevier 2004, Chapter 2). However, such a pulse would have to be very short and hence require a significant amount of RF transmit power, potentially impacting the ability to make the MRI device portable.

Instead, the MRI system of the present invention preferably employs a sweeping RF scheme, similar to that disclosed in U.S. Pat. No. 7,403,006, but with several important differences. For example, instead of using a hyperbolic secant sweep, the present invention preferably takes a more discrete approach using a series of hard-pulses to query a narrow band of spectrum at a time. This is followed by a RX period where no transmit activity takes place, so that the MR signal can be detected. This TX/RX block then repeats at a different, randomly selected frequency as opposed to an orderly progression as taught in U.S. Pat. No. 7,403,006. Hard-pulses ensure that all available RF power is used. The sub-pulse duration, and the RX period duration need to be carefully determined to ensure appropriate image contrast and good signal to noise ratio (SNR).

Figure 38:
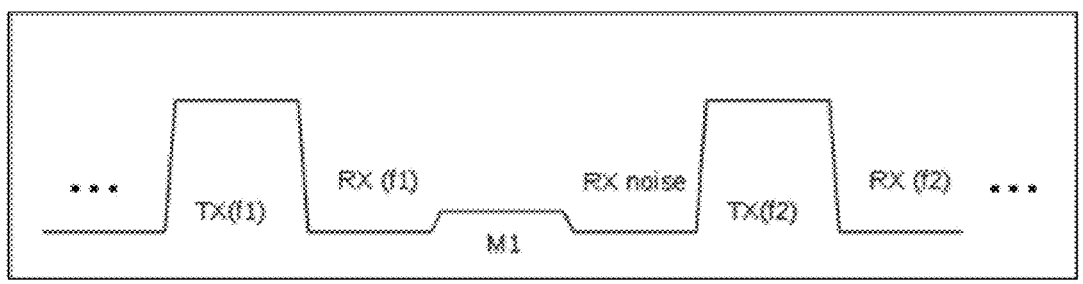
FIG. 38 shows the RF pulse sequence according to an embodiment of the present invention.

In addition, periodic system monitoring pulses are preferably inserted into the pulse chain. Hard RF pulses at full power cause compression in the receive system, while lower power pulses do not. The MRI system of the present invention preferably takes advantage of this, by utilizing a low-power system monitoring RF pulses for system monitoring purposes. The resulting received signal will inform the user of the total gain in the system, from transmit amplifier through the TX/RX coils, onwards to the low noise amplifiers LNAs. If, for example, a receive amplifier was malfunctioning, the user would know from consulting these system monitoring pulses, as the signal from the malfunctioning amplifier channel would be abnormally low. FIG. 38 illustrates an RF pulse sequence according to a preferred embodiment of the present invention. As shown, the RF pulse operates at a narrow band around one frequency at a time. Following is a brief receive period where the signal is recorded. System monitoring is achieved with the system monitoring pulses (M1 in FIG. 38). By measuring the transmit signal of the monitoring pulses seen at the receive end, changes in the receive and transmit coil profiles can be measured. Furthermore, the receive period that follows allows for noise characterization and thus eventual noise cancellation.

Advantageously, these pulses can be used to monitor coil loading, namely the phenomenon that once items are placed near an RF coil, its signal profile changes. Preferably, the system monitoring pulses can be used to determine the total signal profile at a given frequency f. Assuming that the amount of transmit power available limits the flip angle to less than 90 degrees or so (small flip angle approximation), the impact of coil loading on the receive signal is approximately equal to the product of transmit and receive profiles. Preferably, the combined RF TX/RX profile may be corrected for via pilot pulses by simply dividing out the observed TX/RX monitoring pulse power.

Preferably, the monitoring pulses may also be used to provide the signal free receive period that follows (recall the system monitoring pulse is very low-power hence very little MR signal is generated). During this time, the system preferably monitors the signal received. For some noise sources, in particular narrow band interference sources, the unwanted noise can be predicted to a great degree. This allows the present invention to remove its influence on the signal, improving signal to noise ratio (SNR).

Preferably, once the signal has been corrected for coil loading, and strong narrow-band interference has been removed, the total signal is averaged up at the same frequency as the transmit pulse immediately preceding it to generate the observed MR signal at that frequency. As discussed above, for convenience, the observed MR signal is preferably converted to field-strength using the equation above. Due to the relatively inhomogeneous magnetic-field of the MRI system of the present invention, very little remnant signal from the previous receive period is observed leaking in, signal dephasing is such that, more or less all signal is lost once the end of a receive window is reached.

TX-RX Synchronization Methods

Depending on the hardware used in the MRI system according to the present invention, exact synchronization of transmit and receive waveforms may be challenging. If left untreated, this could seriously hinder efforts in attributing a given receive waveform to a given transmit frequency, resulting in sub-par images. This issue arises from latency uncertainties involved in buffered communication between for example the computer and the physical transmit and receive system, for example, a universal software radio peripheral (USRP 1), available from Ettus Research www.ettus.com. Many excellent ways exist to resolve this problem, mostly by carefully controlling each latency component and calibrating appropriately.

Figure 39:
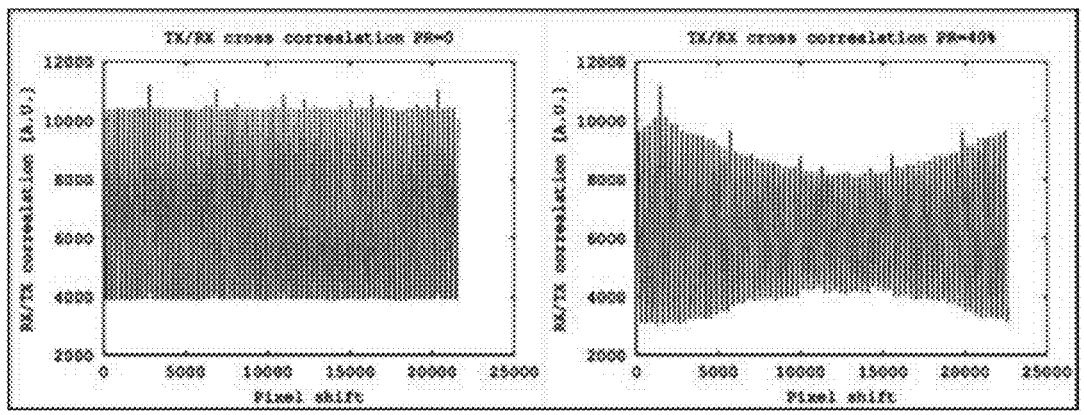
FIG. 39 shows at left a graph of RX/TX correlation vs. pixel shift without pseudo-random synchronization, and at right the same graph where a pseudo-random wait (up to a maximum of 40%) was added.

According to a preferred approach, the USRP 1 uses the same clock to drive the transmit and receive system. Under this approach only bulk shift, and phase errors in the receive signal need to be addressed. The former is preferably addressed first as it is more complex. By artificially lengthening each receive period by a pseudo-random amount, the overall magnitude correlation between the transmit waveform and the received waveform, rapidly converges to the optimal solution. This is illustrated in FIG. 39, where the pseudo-random receive window lengthening is varied from 0 (no artificial lengthening, all receive windows are the same length), to at most 40% of the receive window length. As can be seen, this slight lengthening ensures that there is only one optimal shift estimate available corresponding to the actual shift seen, even in the presence of substantial measurement noise. While 40% may seem excessive (this would lengthen scan time by about 20%), the person skilled in the art can easily select an appropriate value based on observed measurement noise ensuring consistent TX/RX synchronization. This approach is similar to that used by the global positioning system, where the receiver is synchronized to the satellite constellation via a pseudo-random key (Misra et al. Global Positioning System, Signals, measurements and performance, available from gpstextbook.com, chapter 8).

Once bulk shift correction is completed, phase correction is fairly straightforward. Preferably, the frequency and phase of the received transmit pulse is compared to that of the actual transmit pulse and corrected. This helps ensure appropriate phase of the receive window that is to follow.

Image Reconstruction Methods

Figure 40:
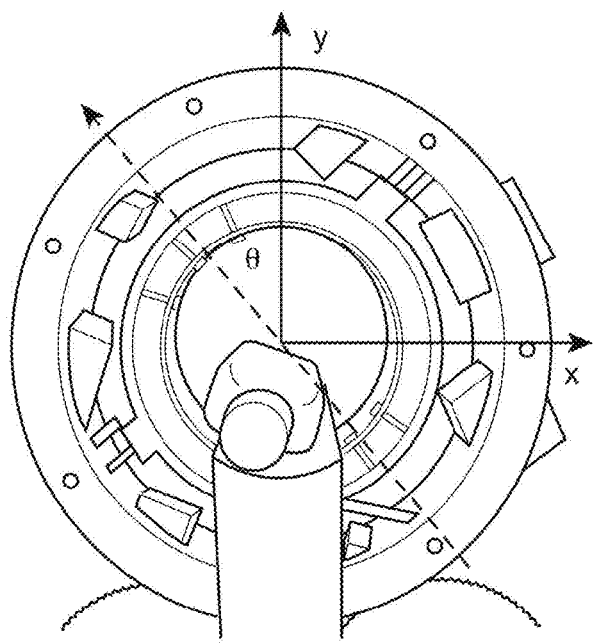
FIG. 40 shows the image scanning process, according to an embodiment of the present invention, in which the magnet assembly rotates around the object to be imaged, at an angle θ, information is collected along the dotted line, two receive coils are employed one on the top the other on the bottom to collect information along the entire line.

Once the signal is received and corrected, the process of converting it to an image begins. As discussed above, the RX coil effectively collects a "slice" of data, thus received data can be thought of belonging to a given image slice. The image reconstruction problem is thus two dimensional. For convenience the image reconstruction problem can be thought of in polar coordinates. As discussed later, the polar coordinate system is a more natural coordinate system for the image reconstruction problem. Therefore, to reconstruct an image, a series of grayscale values must be found for the polar coordinates (r, θ) in the image. FIG. 40 illustrates this concept.

Figure 41:
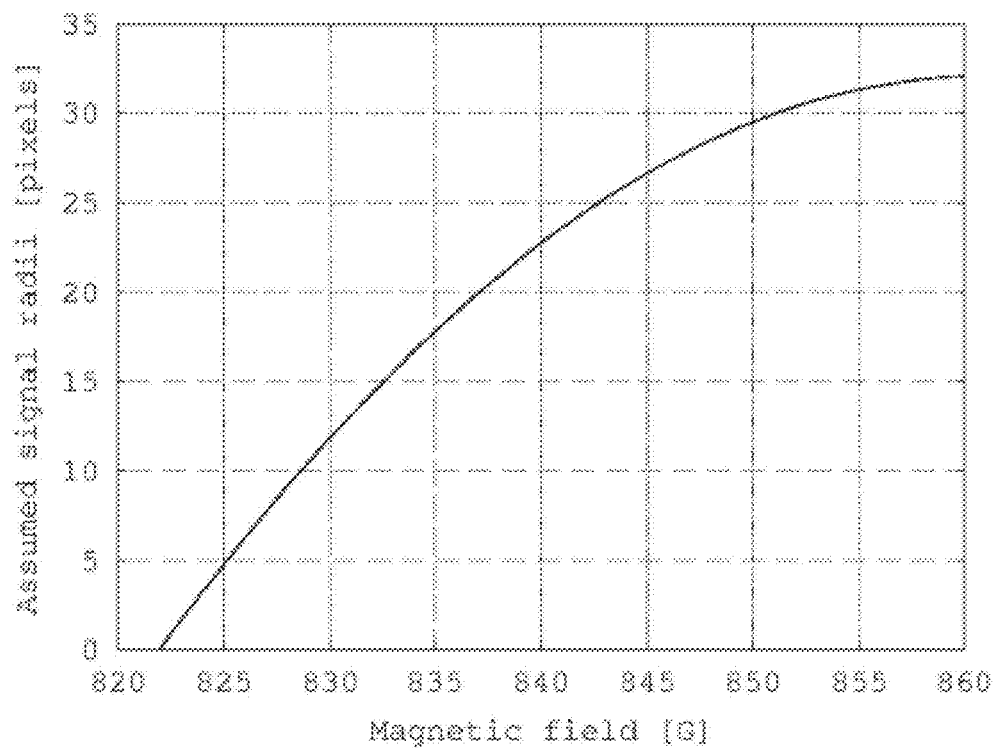
FIG. 41 shows a graph of the assumed signal radii vs. the magnetic field strength.

As discussed above, the pulse sequence delivers information on how much MR signal is present at a given narrowband slice of magnetic field. This (along with which receive coil obtained the signal) allows for determining the radii component of the polar coordinate (the magnet assembly's angle provides the θ). However, the magnetic-field must be transformed to radii components, for example with a simple quadratic expression. As discussed above the magnetic field profile goes quadratically from a low at the center to a high along the edges. A sample transformation is shown in FIG. 41.

Figure 42:
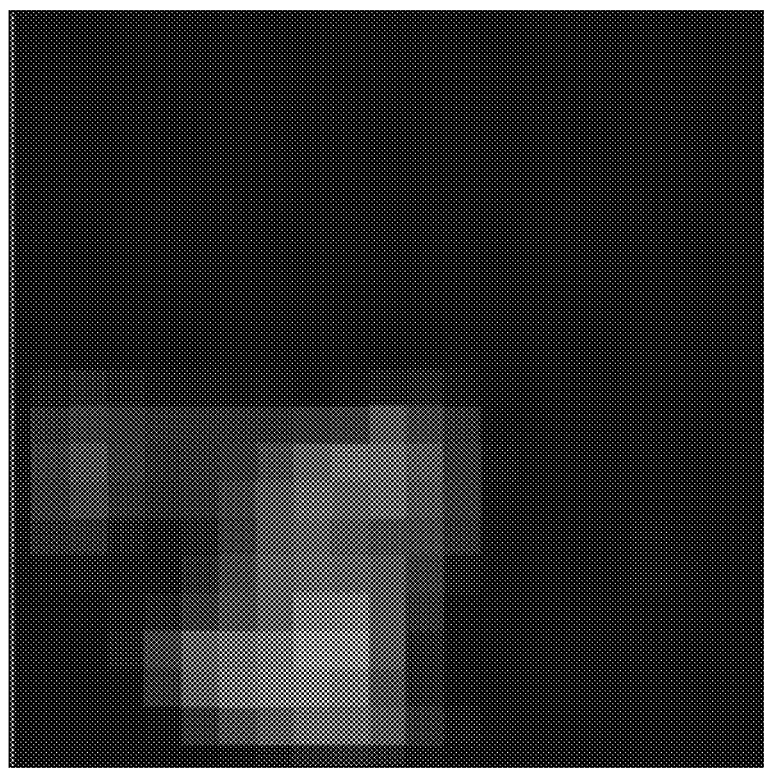
FIG. 42 shows a reconstructed magnetic resonance image according to an embodiment of the present invention.

The discussion above assumes that each data-point (r, θ) corresponds only to a single point in the image. This however, is not true as the coil according to the present invention "smears" the signal somewhat, primarily along the angle direction. This is because the coil spans a 90 degree angle. Experiments with a thin line phantom showed that this smearing is quite significant, expanding over a 150° span, although the strongest signal component is along the center-line of the coil. Preferably, this may be modelled in the following manner:

$$\mathrm{Signal}(r,\theta) = \Sigma a_{ii} \mathrm{Image}(r,\theta_{ii}),$$

where $a_{ii}$ is a weighting function (currently the Hanning window function works well). Preferably, the method of least squares is then employed to retrieve the Image. It has been found to be helpful to employ a regularization function, such as for example, a simple Tikhonov regularization. A sample reconstructed MR image according to an embodiment of the present invention is shown in FIG. 42.

While reference has been made to various preferred embodiments of the invention other variations, implementations, modifications, alterations and embodiments are comprehended by the broad scope of the appended claims. Some of these have been discussed in detail in this specification and others will be apparent to those skilled in the art, such as, for example:

Different size: In the above examples the magnet assemblies were sized to be suitable for imaging the extremities. However, the present invention is not so limited, both larger and smaller magnet assemblies can made using the teachings herein. Furthermore, depending on the size of the magnet assembly, more or fewer rings may be used.

Utilizing other magnetic block sizes. Many possible permanent magnet sizes and shapes exist on the market today. The 1×1×1/2 inch cuboid shaped permanent magnets, mentioned above in association with embodiments of the present invention, were selected as an example only because it is cost effective, light-weight, available in a stronger grade N52, and could be shipped by air. Depending on the desired magnet geometry, a different permanent magnet size and/or shape may be used. Furthermore, different sets of permanent magnets may be used, with for example, a smaller size on the innermost ring(s) and a larger size in rings space outwardly from the innermost ring(s).

Elliptical opening through body of magnet assembly: While the above examples show the permanent magnet segments arranged in circular rings, it is contemplated that in other embodiments of the invention, the rings may be elliptical. For example, as disclosed in U.S. Pat. No. 5,659,250, an elliptical shaped magnet assembly may have some advantages in certain situations.

Imaging into the third dimension. By adding other "slit" coils along the bore axis, multiple image slices could be acquired at the same time, alternatively the magnet assembly may be slid along the axis of the magnet (in addition to the rotation done here).

Increase the number of TX/RX coils. In embodiments of the present invention discussed above the analog/digital system are preferably limited to two receive channels. With custom receive systems, there is no limit to the number of receive or transmit channels one could use. For example, embodiments involving 2 TX and 4 RX channels are feasible.

Spatial location with transmit coil. Embodiments of the present invention discussed above preferably employ a simple loop-coil for transmit, resulting in uniform phase across the imaging volume. This need not be the case, as work from Sharp et al. (Magnetic resonance in medicine, issue 63: pg 151) shows, TX coils can be constructed to deposit varying degrees of phase across the imaging volume, hence contributing to spatial location of the signal. With clever coil construction techniques, perhaps even independently rotating the TX coil, this could result in improved spatial localization of the MR signal, eventually resulting in improved image quality.

Gradient systems. As gradient amplifiers and associated gradient hardware consumes a fair amount of electrical power in traditional MRI systems, embodiments of the present invention discussed above preferably obtain images without a gradient system to permit a portable system. However, gradient systems do have their advantages as they allow tremendous flexibility on how an image is acquired. Karimi et al. (Magnetic resonance in medicine, e-pub only DOI: 10.1002/mrm.24950) published a mechanical gradient system that need not consume much electrical power. Furthermore, low power gradient systems could boost spatial localization and hence image quality close to the edge of the bore. Accordingly, it is contemplated that a hybrid system with a limited gradient system could be constructed.

Improved image reconstruction methods. Recently, sparsity has been proposed as a regularization parameter in medical imaging reconstruction methods (Lustig et al. Magnetic resonance in medicine 58:1182). The image reconstruction method discussed above in relation to embodiments of the present invention is much simpler, and could benefit from considering sparsity to contain blurring as can be seen in the reconstructed image. Although the results presented thus far in the literature are impressive, long reconstruction times remain a major barrier. Of particular interest is the absence of a Fourier transform in a preferred image reconstruction method. This is a consequence of the pulse sequence, in particular, the frequency sweep and random frequency ordering scheme. In practice, this may enhance the speed of compressed sensing image reconstruction, as the Lustig et al. paper shows, a fair amount of computation time is spent on Fourier transforms.

Increased spatial resolution. As can be seen in the sample reconstructed MR image shown in FIG. 41, image resolution has some ways to go to match the resolution available with clinical commercially available MRI systems. It is contemplated that better image resolution may be achieved by embodiments of the present invention discussed above by increasing the amount of radial information obtained in the pulse sequence, as well as fine-tune the modeling functions. It is contemplated that one approach may be to utilize multi-tone hard pulses, briefly combining several carefully selected frequencies into a single pulse. While this does approach traditional Fourier-style pulses, the MRI system according to the present invention need not interact with the entire imaging volume at the same time, thus saving RF power.

Those of ordinary skill in the art having access to the teachings herein will recognize these additional variations, implementations, modifications, alterations and embodiments, all of which are within the scope of the present invention, which invention is limited only by the appended claims.

What is claimed is:

1. A magnet assembly for a magnetic resonance imaging (MRI) instrument, said magnet assembly comprising:
   a body having an opening through said body sized and shaped to receive an object, said opening defining a longitudinal axis through a centre of said opening; and
   a plurality of permanent magnet segments, each having a magnetization direction, attached to said body to generate a magnetic field profile within said opening, said plurality of permanent magnets being arranged in each of a first ring and a second ring, said first and second rings being spaced apart from each other along said longitudinal axis, said plurality of permanent magnet segments being evenly spaced apart from adjacent permanent magnet segments in each of said respective first and second rings;
   wherein said permanent magnet segments define two rotations of said magnetization directions in each of said respective first and second rings; and
   wherein said first ring defines a first plane perpendicular to said longitudinal axis, and said second ring defines a second plane perpendicular to said longitudinal axis, and at least some of said permanent magnet segments in said first or second rings are oriented out of alignment with said respective first or second planes.

2. The magnet assembly as claimed in claim 1, wherein said plurality of permanent magnet segments includes permanent magnet segments arranged in a third ring positioned between said first and said second rings; wherein said first, second, and third rings are spaced apart from each other along said longitudinal axis; and wherein said third ring defines a third plane perpendicular to said longitudinal axis; and wherein all of said magnetization directions of said permanent magnet segments in said third ring are substantially aligned with said third plane.

3. The magnet assembly as claimed in claim 2, wherein said plurality of permanent magnet segments includes permanent magnet segments arranged in at least one additional pair of rings positioned outwardly of said first and second rings.

4. The magnet assembly as claimed in claim 2, wherein said first and second rings each have a smaller diameter than the diameter of said third ring.

5. The magnet assembly as claimed in claim 1, wherein said body includes magnet holders in each of said first and second rings, adapted to hold said permanent magnet segments in place.

6. The magnet assembly as claimed in claim 5, wherein each of said permanent magnet segments comprises a pair of spaced apart permanent magnets having the same magnetization direction; and wherein one of said pair of spaced apart permanent magnets is spaced outwardly from the other of said pair of spaced apart permanent magnets, relative to said center of said opening, such that said magnetization directions of said pair of permanent magnets are substantially aligned.

7. The magnet assembly as claimed in claim 5, wherein each of said magnet holders includes a non-magnetic attachment member sized and shaped to permit said pair of permanent magnets to clamp to said non-magnetic attachment member by the force of their magnetic attraction to one another, across said non-magnetic attachment member.

8. The magnet assembly as claimed in claim 1, wherein said magnetic field profile has a substantially constant magnetic strength along a portion of said opening along said longitudinal axis, and is substantially uniform radially about said longitudinal axis in a plane perpendicular to said longitudinal axis, over said portion of said opening.

9. The magnet assembly as claimed in claim 1, wherein said magnetic field profile has a substantially constant magnetic strength along a portion of said opening along said longitudinal axis, and is substantially non-uniform radially about said longitudinal axis in a plane perpendicular to said longitudinal axis, over said portion of said opening.

10. The magnet assembly as claimed in claim 9, wherein said magnetic strength of said magnetic field profile is linear in a direction perpendicular to said longitudinal axis.

11. The magnet assembly as claimed in claim 1, wherein said first ring and said second ring are circular or elliptical.

12. An MRI instrument comprising:
a magnet assembly according to claim 1; and
a radio frequency coil for generating RF energy and receiving magnetic resonance signals from an object positioned in said magnet assembly.

13. The magnet assembly as claimed in claim 1, wherein said body is formed from plastic.

14. The magnet assembly as claimed in claim 13, wherein said body is a one piece construction.

15. The magnet assembly as claimed in claim 13, wherein said body is formed by 3D printing.

16. The magnet assembly as claimed in claim 1, wherein said permanent magnet segments are block magnets, each of said block magnet defining a face and having a magnetization direction perpendicular to said face; and wherein at least some said block magnets are attached to said body at an angle relative to said longitudinal axis such that their faces are not parallel to said longitudinal axis, and their magnetization directions are not perpendicular to said longitudinal axis.

17. The MRI instrument as claimed in claim 12, further comprising a processor for processing said magnetic resonance signals received by said radio frequency coil, and an output device for displaying said processed signals in a visual form.

* * * * *